(12) United States Patent
Endo

(10) Patent No.: US 6,818,899 B2
(45) Date of Patent: Nov. 16, 2004

(54) RADIOGRAPHIC IMAGE PICKUP APPARATUS AND METHOD OF DRIVING THE APPARATUS

(75) Inventor: Tadao Endo, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 82 days.

(21) Appl. No.: 10/157,973

(22) Filed: May 31, 2002

(65) Prior Publication Data

US 2003/0038242 A1 Feb. 27, 2003

(30) Foreign Application Priority Data

Jun. 7, 2001 (JP) .................................. 2001-172733

(51) Int. Cl.[7] .............................................. H01L 27/14
(52) U.S. Cl. ............................. 250/370.14; 250/370.08
(58) Field of Search ...................... 250/370.01, 370.08, 250/370.09, 370.14, 371, 370.11

(56) References Cited

U.S. PATENT DOCUMENTS 5,818,052 A * 10/1998 Elabd .................... 250/370.09
6,080,997 A 6/2000 Tashiro et al. ................ 257/28
6,512,217 B1 * 1/2003 Kameshima ............. 250/208.1

* cited by examiner

*Primary Examiner*—Constantine Hannaher
*Assistant Examiner*—Timothy J. Moran
(74) *Attorney, Agent, or Firm*—Fitzpatrick, Cella, Harper & Scinto

(57) ABSTRACT

To provide a radiographic image pickup apparatus comprising a substrate, a plurality of pixels each of which is constituted by an MIS-type photoelectric conversion device and a switching device, the pixels being two-dimensionally arranged on the substrate, a plurality of control wirings connected to control electrodes of the switching devices, a plurality of signal wirings for reading signals from the MIS-type photoelectric conversion devices, and second switching unit for switching a bias for turning on the switching device to at least one of a first bias and a second bias.

14 Claims, 20 Drawing Sheets

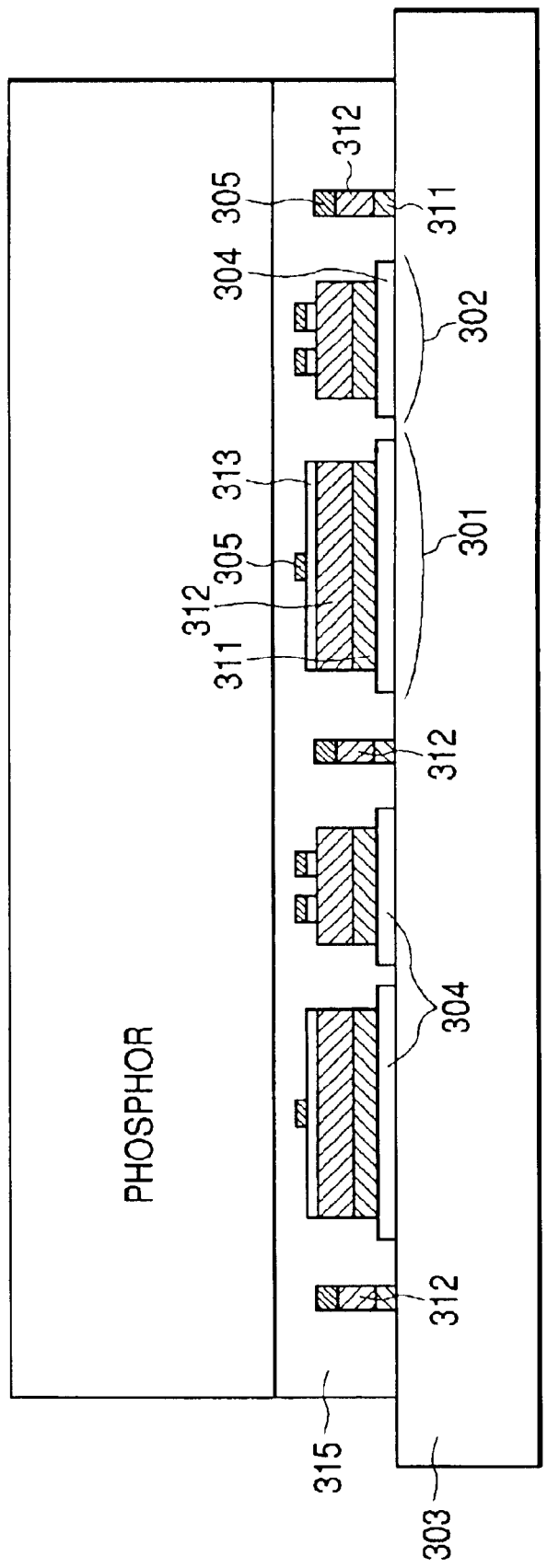

REFRESH MODE

PHOTOELECTRIC CONVERSION MODE

SATURATED STATE

RADIOGRAPHIC IMAGE PICKUP APPARATUS AND METHOD OF DRIVING THE APPARATUS

BACKGROUND OF THE INVENTION

1. Field of the Invention

The present invention relates to a radiographic image pickup apparatus and, more particularly, to a radiographic image pickup apparatus used for medical diagnosis or non-destructive inspection in an industrial process.

In this specification, radiation includes electromagnetic waves such as X-rays, alpha rays, beta rays, and gamma rays, and descriptions will be made based thereon.

2. Related Background Art

X-ray photographing systems installed in hospitals, etc., are divided into analog systems in which a subject is irradiated with X-rays and a film is exposed to X-rays reaching the film after passing through the subject, and digital systems in which X-rays passing through a subject are converted into an electric signal, which is stored, for example.

As a digital system, a radiographic image pickup apparatus is known which is constituted by a phosphor for converting X-rays into visible light and a photoelectric converter for converting the visible light into an electric signal. X-rays pass through a subject and the phosphor is irradiated with the X-rays and converts the X-rays into visible light for information about internal portions of the subject's body. The photoelectric converter converts the visible light into an electrical signal and outputs this signal. In the form of the converted electrical signal, X-ray image information to be recorded, displayed, printed or used for diagnosis can be treated as digital values after being digitized by an A/D converter.

Radiographic image pickup apparatuses using an amorphous silicon semiconductor thin film for a photoelectric converter have recently been put into practical use.

FIG. 13 is a top view of an example of a photoelectric conversion substrate in which photoelectric conversion devices of a metal insulator semiconductor (MIS) type and switching devices are formed by using an amorphous silicon semiconductor thin film as materials therefor. Wirings for connecting the devices are also illustrated in FIG. 13. FIG. 14 is a cross-sectional view taken along the line 14—14 of FIG. 13. The MIS-type photoelectric conversion device will be referred to simply as "photoelectric conversion device" in the following description for the sake of simplicity.

Photoelectric conversion devices 301 and switching devices 302 (amorphous silicon TFTs, hereinafter referred to simply as "TFT") are formed on one substrate 303. A lower electrode of each photoelectric conversion device and a lower electrode (gate electrode) of each TFT are formed from a common layer, i.e., a first metallic thin film layer 304. An upper electrode of each photoelectric conversion device and upper electrodes (source electrode and drain electrode) of each TFT are also formed from a common layer, i.e., a second metallic thin film layer 305. Gate drive wirings 306 and matrix signal wirings 307 in a photoelectric conversion circuit section are also formed from the first and second metallic thin film layers. A layer 313 is an $N^+$-layer, a layer 312 is an intrinsic semiconductor layer, and a layer 311 is an insulating layer made of SiNx for example. The pixels in number corresponding to 2'2, i.e., four pixels in total are illustrated in FIG. 13. Hatched areas in FIG. 13 represent light receiving surfaces of the photoelectric conversion devices. Power supply lines 309 for biasing the photoelectric conversion devices are also provided. The photoelectric conversion devices and TFTs are connected to each other via contact holes 310.

The device operation of the photoelectric conversion device singly formed will be described by way of example.

FIGS. 15A to 15C are energy band diagrams for explaining the device operation of the photoelectric conversion device shown in FIGS. 13 and 14.

FIGS. 15A to 15C show operations in a refresh mode and in a photoelectric conversion mode, respectively, and show states in the film thickness direction of the layers shown in FIG. 14. A layer M1 is the lower electrode (G-electrode) formed of the first metallic thin film layer (e.g., film of Cr). An a-SiNx layer is an insulating layer which blocks both passage of electrons and passage of holes. It is necessary that the thickness of the a-SiNx layer be large enough to prevent a tunnel effect. Ordinarily, the thickness of the a-SiNx layer is set to 500 angstroms or more. An a-Si-layer is a photoelectric conversion semiconductor layer formed of an intrinsic semiconductor i-layer. An $N^+$-layer is an N-type injection blocking layer for blocking injection of holes into the a-Si-layer. A layer M2 is the upper electrode (D electrode) formed of the second metallic thin film layer (e.g., film of Al).

In the structure shown in FIG. 13, the $N^+$-layer is not completely covered with the D-electrode but the D-electrode and the $N^+$-layer are always equipotential since electrons can move freely therebetween. The following description should be read on this understanding.

This photoelectric conversion device has two operation modes: a refresh mode and a photoelectric conversion mode in correspondence with different ways of applying voltages to the D-electrode and a G-electrode.

In the refresh mode, for example, a negative potential is applied to the D-electrode relative to that applied to the G-electrode, and holes indicated by black round marks in the i-layer are caused by the electric field to move toward the D-electrode, as shown in FIG. 15A. Simultaneously, electrons indicated by white round marks are injected into the i-layer. At this time, part of holes and part of electrons recombine with each other in the $N^+$- and i-layers to disappear. If the device is maintained in this state for a sufficiently long time, holes in the i-layer are swept out from this layer.

To set the device in the mode shown in FIG. 15B from this mode, a positive potential is applied to the D-electrode relative to that applied to the G-electrode. Then electrons in the i-layer are caused to move instantaneously toward the D-electrode. However, holes are not caused to move to the i-layer since the $N^+$-layer functions as an injection blocking layer. When light enters the i-layer in this state, light is absorbed to generate electron-hole pairs. These electrons are caused by the electric field to move toward the D-electrode, while the holes move through the i-layer to reach the interface between the i-layer and the a-SiNx insulating layer. Since the holes cannot move into the insulating layer, they stay in the i-layer. At this time, with the movement of electrons to the D-electrode and the movement of holes to the insulating layer interface of the i-layer, a current flows from the G-electrode to maintain the electrical neutrality in the photoelectric conversion device. This current corresponds to the electron-hole pairs generated by the light and is therefore proportional to the quantity of light entering the photoelectric conversion device. After the device has been maintained for a certain time period in the state in the photoelectric conversion mode shown in FIG. 15B, it enters the state in the refresh mode shown in FIG. 15A. The holes which have stayed in the i-layer are caused to move toward the D-electrode as described above and a current flows which corresponds to this flow of the holes. This amount of holes corresponds to the entire quantity of light entering during the photoelectric conversion mode period. At this time, a current also flows which corresponds to the amount of electrons injected into the i-layer. However, this amount is approximately constant and may be subtracted from the total amount to obtain the detection result. That is, this photoelectric conversion device outputs the quantity of light entering the device in real time, and is also capable of detection of the entire quantity of light entering during a certain period.

However, in a situation where the photoelectric conversion mode period is increased for some reason or in a situation where the illumination intensity of light incident on the device is high, there is a possibility of failure to obtain the desired current while light enters the device. This is because, as shown in FIG. 15C, many holes are accumulated in the i-layer, the electric field in the i-layer is reduced by the holes, and electrons generated are not caused to move but recombined with the holes in the i-layer. This state is called a saturated state of the photoelectric conversion device. If in this state the incident state of light is changed, a current may start to flow unstably in some cases. However, when the photoelectric conversion device is again set in the refresh mode, the holes in the i-layer are swept off. In the following photoelectric conversion mode, a current flows again in proportion to light.

In the operation described above, it is desirable from an idealistic viewpoint that all holes in the i-layer be swept off in the refresh mode. However, sweeping off only part of the holes is effective and sufficient for obtaining the current equal to that described above with no problem. That is, avoiding the state shown in FIG. 15C at the next detection chance in the photoelectric conversion mode may suffice, and the D-electrode potential relative to the G-electrode potential in the refresh mode, the refresh mode period and the characteristic of the injection blocking layer of N$^+$-layer may be determined. Further, injection of electrons into the i-layer in the refresh mode is not a necessary condition and the D-electrode potential relative to the G-electrode potential is not limited to a negative. This is because, in a case where a number of holes are staying in the i-layer, the electric field in the i-layer acts in such a direction as to cause holes to move toward the D-electrode even when the D-electrode potential relative to the G-electrode potential is positive. Also, limitation of the injection blocking layer of N$^+$-layer to such a characteristic that electrons can be injected into the i-layer is not a necessary condition.

FIG. 16 shows a conventional photoelectric conversion circuit corresponding to that for one pixel, which is constituted by a photoelectric conversion device and a TFT.

In FIG. 16, the photoelectric conversion device is represented by a capacitive component $C_i$ formed by the i-layer and a capacitive component $C_{SiN}$ formed by the injection blocking layer. At the point corresponding to the junction between the i-layer and the injection blocking layer (node N in FIG. 16), electrons and holes generated by light recombine with each other when the photoelectric conversion device is saturated, that is, no electric field (only a reduced electric field) exists between the D-electrode and the node N (i-layer). In this state, therefore, hole carriers cannot be stored in the portion N. That is, the node N potential does not exceed the D-electrode potential under any condition. To realize expression of the operation in this saturated state, a diode (D1) is connected in parallel with $C_i$ in FIG. 16. That is, in FIG. 16, the photoelectric conversion device is expressed by three components $C_i$, $C_{SiN}$, and D1.

FIG. 17 is a time chart showing the operation of the circuit for one pixel shown in FIG. 16.

The operation of the circuit for one pixel, constituted by the photoelectric conversion device and the TFT, will be described with reference to FIGS. 16 and 17.

A refresh operation will first be described.

It is assumed that Vs is 9V and Vref is 3V. To start the refresh operation, a switch SW-A is set for application of Vref, a switch SW-B is set for application of Vg(on), and a switch SW-C is turned on. In this state, the D-electrode is biased at Vref(6V), the G-electrode is biased at a GND potential, and the node N is biased at Vref(6V) at the maximum. The reason for adding "at the maximum" is as described below. If the potential at the node N has already been increased to a level equal to or higher than Vref by the photoelectric conversion operation before the present refresh operation, the node N is biased at Vref via the D1 by the present refresh operation. However, if the potential at the node N resulting from the preceding photoelectric conversion operation is Vref or less, the node N is not biased at the potential Vref by the present refresh operation. It can be said that, in actual use, the node N is biased virtually at Vref(6V) by this refresh operation if the photoelectric conversion operation has been repeated a certain number of times in advance. After the node N has been biased at Ref.(6V), the SW-A is changed to the Vs side. The D-electrode is thereby biased at Vs(9V). By this refresh operation, hole carriers accumulated at the node N of the photoelectric conversion device are swept thoroughly to the D-electrode side.

An X-ray irradiation period will next be described. X-rays are emitted in a pulsating manner, as shown in FIG. 17. A phosphor 1001 is irradiated with X-rays which have passed through a subject. The phosphor loot converts the X-rays into visible light. The visible light from the phosphor is radiated to the semiconductor layer (i-layer) to be converted into an electric signal by photoelectric conversion. Hole carriers produced by photoelectric conversion are accumulated at the node N to increase the potential at this node. Since the TFT is off, the potential at the G-electrode side is correspondingly increased.

A wait period is set between the refresh period and the X-ray irradiation period. In this period, no particular operation is performed and the device is left in a non-operated state to become relieved from a condition of instability in characteristics, if any, due to dark current immediately after refresh operation. If there is no possibility of the photoelectric conversion device being unstable in characteristics immediately after refresh operation, it is not necessary to specially set the wait period.

A transfer operation will next be described. To start the transfer operation, the switch SW-B is set for connection at the Vg(on) side, thereby turning on the TFT. Electron carriers ($S_e$) corresponding to the amount of hole carriers ($S_h$) accumulated by X-ray irradiation are thereby caused to flow from the C2 side to the G-electrode through the TFT, thereby increasing the potential at the read capacitance C2. The relationship between $S_e$ and $S_h$ is as expressed by $S_e = S_h \cdot C_{SiN}/(C_{SiN}+C_i)$. Simultaneously, the potential at the C2 is amplified by an amplifier to be output. The TFT is maintained in the on state for a time long enough to transfer a sufficient amount of signal charge and is thereafter turned off.

Finally, a reset operation is performed. To start the reset operation, the switch SW-C is turned on. The capacitance C2 is thereby reset to the GND potential, thus preparing for the next transfer operation.

FIG. 18 is a two-dimensional circuit diagram of a conventional photoelectric converter. Only a portion of the converter corresponding to 3'3=9 pixels is illustrated for ease of description. Photoelectric conversion devices are indicated by S1-1 to S3-3; switching devices (TFTs) are indicated by T1-1 to T3-3; gate wirings for turning on and off the TFTs are indicated by G1-1 to G3-3; and signal wirings are indicated by M1 to M3. A Vs-line is a wiring for applying a storage bias or refresh bias to the photoelectric conversion devices. Electrodes of the photoelectric conversion devices represented by solid filled rectangles are G-electrodes, while electrodes at the opposite side are D-electrodes. Portions of the Vs-line are used for the D-electrodes. For convenience in enabling entrance of light, a thin $N^+$-layer is used to form the D-electrodes. The group of components: S1-1 to S3-3, T1-1 to T3-3, G1 to G3, M1 to M3, and the Vs-line will be referred to collectively as a photoelectric conversion circuit section (101).

The Vs-line is biased by a Vs power supply 106A or a Vref power supply 106B, which is selected by using a control signal VSC. A shift register 102 is provided to supply a drive pulse voltage to the wirings G1 to G3. The voltage for turning on the TFTs is determined by and externally supplied from a power supply (VG(on)). A read circuit section 107 is provided in which parallel signal outputs from the wirings M1 to M3 in the photoelectric conversion circuit section 101 are amplified and converted into a serial signal to be output.

In the read circuit section 107 are provided switches RES1 to RES3 for resetting M1 to M3, amplifiers A1 to A3 for amplifying signals from M1 to M3, sample and hold capacitors CL1 to CL3 for temporarily storing the signals amplified by the amplifiers A1 to A3, switches Sn1 to Sn3 for sampling and holding, buffer amplifiers B1 to B3, switches Sr1 to Sr3 for converting parallel signals into a serial signal, a shift register 103 for supplying pulses for parallel-to-serial conversion to the switches Sr1 to Sr3, and a buffer amplifier 104 for outputting the converted serial signal.

FIG. 19 is a time chart showing the operation of the photoelectric converter shown in FIG. 18. The operation of the photoelectric converter shown in FIG. 18 will be described with reference to the time chart of FIG. 19. Through control signal VSC, one of two different biases is applied to the Vs-line of the photoelectric conversion devices, i.e., the D-electrodes of the photoelectric conversion devices. Each D-electrode has a potential Vref (V) when the VSC is "Hi" and a potential VS(V) when the VSC is "Lo". DC power supplies 106A and 106B supply the read power supply voltage VS(V) and refresh power supply voltage Vref (V), respectively.

The operation in a refresh period will be described. All the signals from the shift register 102 are set to "Hi" and a signal CRES in the read circuit section is set to "Hi". All the switching TFTs (T1-1 to T3-3) are thereby turned on, the switching devices RES1 to RES3 in the read circuit section are also turned on, and the GND potential is set at the G-electrodes of all the photoelectric conversion devices. When the signal VSC becomes "Hi", the D-electrodes of all the photoelectric conversion devices are biased at the refresh power supply voltage Vref (negative potential). All the photoelectric conversion devices S1-1 to S3-3 are thereby set in the refresh mode, thus performing refreshment.

The operation in a photoelectric conversion period will next be described. The VSC is changed to "Lo" and the D-electrodes of all the photoelectric conversion devices are biased at the read power supply voltage VS (positive potential). The photoelectric conversion devices are thereby set in the photoelectric conversion mode. In this state, all the signals from the shift registers 102 are set to "Lo" and the signal CRES in the read circuit section is also set to "Lo". All the switching TFTs (T1-1 to T3-3) are thereby turned off and the switching devices RES1 to RES3 in the read circuit section are also turned off. The G-electrodes of all the photoelectric conversion devices are set in a DC-open state. However, the potential at each G-electrode is maintained since the photoelectric conversion device also functions as a capacitor. At this point of time, however, no light enters each photoelectric conversion device and no charge is generated in the photoelectric conversion device, that is, no current flows. When in this state a light source is turned on in a pulsating manner, the D-electrode ($N^+$-electrode) of each photoelectric conversion device is irradiated with light and a so-called photocurrent flows through the device. The light source, although not shown in FIG. 18, is, for example, a fluorescent lamp, LEDs, or a halogen lamp in the case of use in a copying machine. In the case of use in an X-ray image pickup apparatus, the light source is, of course, an X-ray source. In this case, a scintillator for conversion of X-rays into visible light may be used. Photocurrent caused by light to flow accumulates as charge in each photoelectric conversion device, which is held after the light source has been turned off.

Next, the operation in a read period will be described. The read operation is performed in the order of the first line corresponding to S1-1 to S1-3, the second line corresponding to S2-1 to S2-3, and the third line corresponding to S3-1 to S3-3. First, to read first-line signals from S1-1 to S1-3, the shift register SR1 supplies a gate pulse to the gate wiring G1 connected to the switching devices (TFTs) T1-1 to T1-3. The high level of the gate pulse supplied at this time is a voltage Vcom externally supplied. The TFTs T1-1 to T1-3 are thereby turned on and signal charges accumulated in S1-1 to S1-3 are transferred to the signal wirings M1 to M3. Read capacitances (not shown in FIG. 18) are added to the signal wirings M1 to M3 and the signal charges are transferred to the read capacitances via the TFTs. For example, the read capacitance added to the signal wiring M1 is the sum of the gate-source interelectrode capacitances (Cgs) (three capacitances) of the TFTs T1-1, T2-1, and T3-1 connected to the signal wiring M1, and corresponds to C2 shown in FIG. 16. The signal charges transferred to the signal wirings M1 to M3 are amplified by the amplifiers A1 to A3. Then the signal CRES is turned on to transfer the charges to the sample and hole capacitors CL1 to CL3. When the signal CRES is turned off, the transferred charges are held on the capacitors CL1 to CL3. Subsequently, the shift register 103 applies a pulse to the switches Sr1, Sr2, and Sr3 so that the switches receive the pulse one after another in the order of Sr1, Sr2, and Sr3. The signals held on the capacitors CL1 to CL3 are then output from the amplifier 104 in the order of CL1, CL2, and CL3. Consequently, the signals obtained by photoelectric conversion from S1-1, S1-2, and to S1-3 for the first line are successively output. The operation for reading second-line signals from S2-1 to S2-3, and the operation for reading third-line signals from S3-1 to S3-3 are performed in the same manner.

If signals on the wirings M1 to M3 are sampled and held on CL1 to CL3 by using the first-line sample signals, then the wirings M1 to M3 can be reset to the GND potential by the signal CRES, followed by application of the gate pulse to the wiring G2. That is, while parallel-to-serial conversion of the first-line signals is performed by the shift register SR2, second-line signal charges from the photoelectric conversion devices S2-1 to S2-3 can be simultaneously transferred by the shift register SR1.

The signal charges on all the photoelectric conversion devices corresponding to the first to third lines can be output by the above-described read operations.

To obtain a series of moving images, the operation shown in the time chart of FIG. 19 may be repeated the number of times corresponding to the number of moving images to be obtained.

However, to obtain moving images having an increased number of pixels, it is necessary to further improve the frame frequency.

In case that a refreshment operation is performed through Vs line common to all photoelectric conversion devices, it would be necessary to provide one refreshment period per one frame. That would cause a problem that, at a movie image pick-up, frame frequency would be made small, that is, speed would be slower.

In general, design as a specification for simple image pick-up of a chest, it is required that an image pick-up area is not smaller than 40 cm square, pixel pitch is not larger than 200 $\mu$m. For example, when the image pick-up area is 40 cm square and the pixel pitch is 200 $\mu$m, total number of the photoelectric conversion devices is 4,000,000. When such larger number of image pick-up devices are to be refreshed collectively simultaneously, a larger current flows at the refreshment. Accordingly, a voltage change at GND and a power source line of X-ray image pick-up apparatus would be larger. In image pick-up of a particular case, during a time period of making stable the voltage change, it would be necessary to provide waiting period before the X-ray irradiation. That is the WAIT period shown in FIG. 17. That is, for the simultaneous and collective refreshment of the photoelectric conversion devices, it is necessary not only to provide the one refreshment period in one frame, but also to provide one wait period in one frame.

As described in the above, it is a technical problem in the prior art that one refreshment at all image pick-up devices would be necessary for one reading operation, and thus the movie image pick-up would be difficult.

SUMMARY OF THE INVENTION

The present invention has been made in view of the above-mentioned problems, and in order to solve the problems, according to the present invention, there is provided a radiographic image pickup apparatus comprising: a substrate; a plurality of pixels each of which is constituted by an MIS-type photoelectric conversion device and a switching device, the pixels being two-dimensionally arranged on the substrate; a plurality of control wirings connected to control electrodes of the switching devices; a plurality of signal wirings for reading signals from the MIS-type photoelectric conversion devices; and second switching means for switching a bias for turning on the switching device to at least one of a first bias and a second bias.

Detailed description thereof will be made with regard to the following embodiments of the present invention.

BRIEF DESCRIPTION OF THE DRAWINGS

FIG. 14 is a cross-sectional view taken along the line 14—14 of FIG. 13;

DETAILED DESCRIPTION OF THE PREFERRED EMBODIMENTS

An embodiment of the present invention includes means for refreshing MIS-type photoelectric conversion devices corresponding to any one of a plurality of lines (rows) after signal charges have been transferred from the MIS-type photoelectric conversion devices by a shift register and before signal charges on the photoelectric conversion devices corresponding to the next line are transferred. Applying a high voltage pulse to gate wirings connected to TFTs by using the same shift register may suffice as the refresh means. In such a case, the MIS-type photoelectric conversion devices are refreshed through the capacitances of the gate insulating films of the TFTs. According to the present invention, this refresh operation is performed on a line-by-line scanning basis to refresh the rows of photoelectric conversion devices one after another. That is, line-by-line refreshment is performed instead of refreshing all the pixel-forming elements at one time with respect to each read frame. The number of MIS-type photoelectric conversion devices to be refreshed at one time corresponds to the number of pixels along one line, which is much smaller than that in the conventional art. Therefore the amount of transient current flowing immediately after each unit refreshment period is markedly small and there is no considerable fluctuations of the GND potential and power supply lines of an X-ray image pickup apparatus. Consequently, the photoelectric conversion devices can be successively operated repeatedly line by line. Further, frame read scanning may be performed in the same manner to obtain moving images.

Moving images thus obtained has an increased frame frequency since the wait time before X-ray irradiation is reduced.

Embodiments of the present invention will be described below in detail with reference to the accompanying drawings.

Embodiment 1

Figure 1:
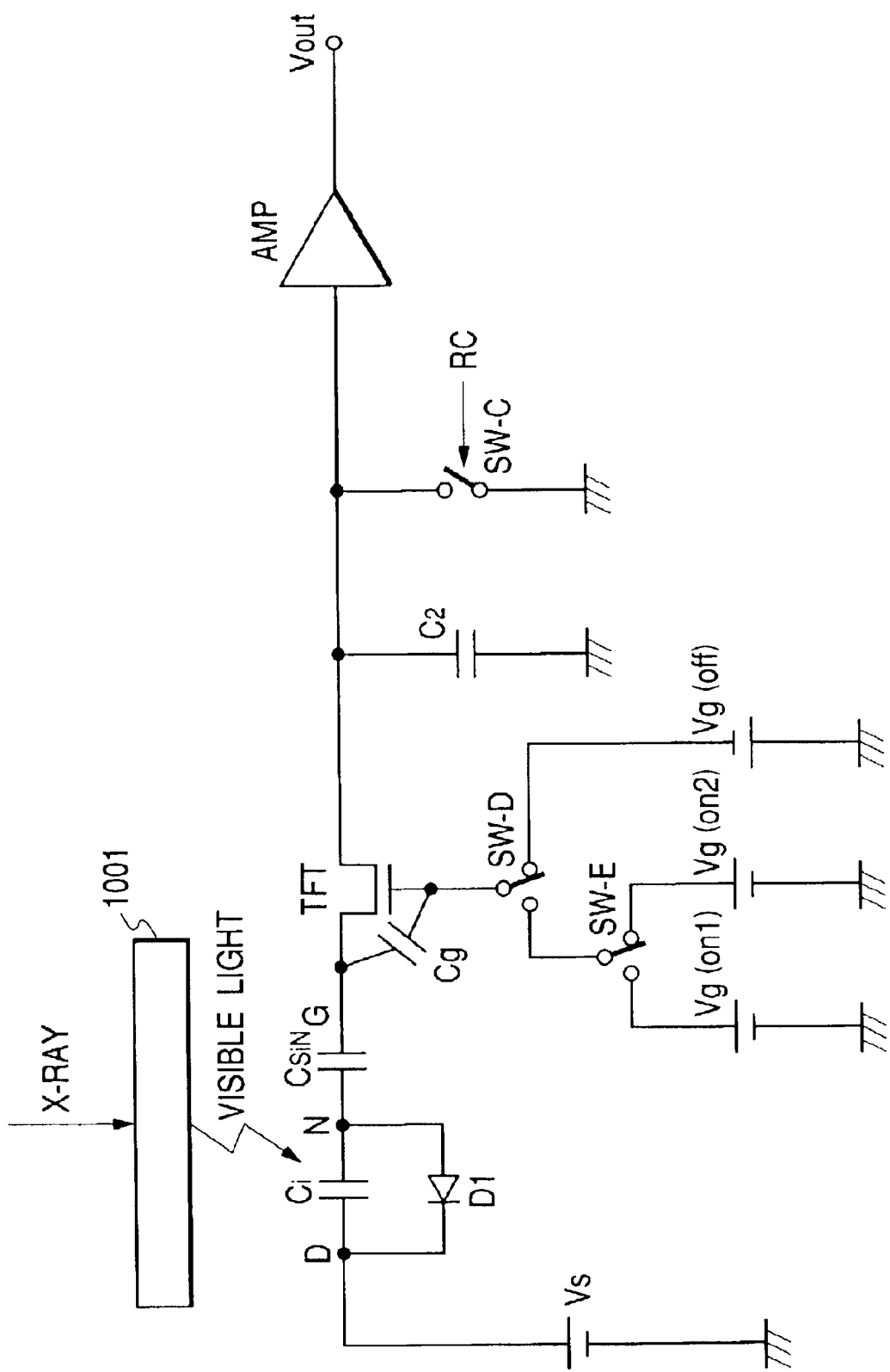
FIG. 1 is an equivalent circuit diagram of a portion, corresponding to one pixel, of an X-ray image pickup apparatus which represents a first embodiment of the present invention.

FIG. 1 is an equivalent circuit diagram of a portion, corresponding to one pixel, of an X-ray image pickup apparatus which represents an embodiment of the present invention. A photoelectric conversion device is represented by a capacitive component $C_i$ formed by an i-layer and a capacitive component $C_{SiN}$ formed by an injection blocking layer. At the point corresponding to a junction between the i-layer and the injection blocking layer (node N in FIG. 1), electrons and holes generated by light recombine with each other when the photoelectric conversion device is saturated, that is, no electric field (only a reduced electric field) exists between the D-electrode and the node N (i-layer). In this state, therefore, hole carriers cannot be stored in the portion N. That is, the node N potential does not exceed the D-electrode potential under any condition. To realize expression of the operation in this saturated state, a diode (D1) is connected in parallel with $C_i$ in FIG. 1. That is, in FIG. 1, the photoelectric conversion device is expressed by three components $C_i$, $C_{SiN}$, and D1.

A phosphor 1001 is provided for wavelength conversion from an X-ray wavelength into a visible light wavelength. $Gd_2O_2$, $Gd_2O_3$ or the like is used as a basic material for the phosphor. A rare-earth element such as $Tb^{3+}$ or $Eu^{3+}$ is used at an emission center. Alternatively, a phosphor using CsI such as CsI:Tl or CsI:N as a basic material may be used.

A power supply Vs is provided to apply a bias to the D-electrode of the photoelectric conversion device. A thin film transistor (TFT) is provided as a switching device. A read capacitance C2 is added to the signal wiring. An ordinary transistor may be used as the switching device. However, use of a TFT as in this embodiment is preferred because noise due to absorption of radioactive rays in the TFT is smaller.

A switch SW-C is a switch for resetting the C2 to a GND potential. The switch SW-C is controlled by a signal RC. A power supply Vg(on1) for refreshing the photoelectric conversion device, a power supply Vg(on2) for turning on the TFT to transfer signal charge to the C2, and a power supply Vg(off) for turning off the TFT are provided.

A switch SW-E for switching between Vg(on1) and Vg(on2) and a switch SW-D for switching between V(off) and Vg(on1) or Vg(on2) are also provided. A capacitance Cg is formed between the gate electrode and the drain electrode (photoelectric conversion device side) of the TFT.

Figure 2:
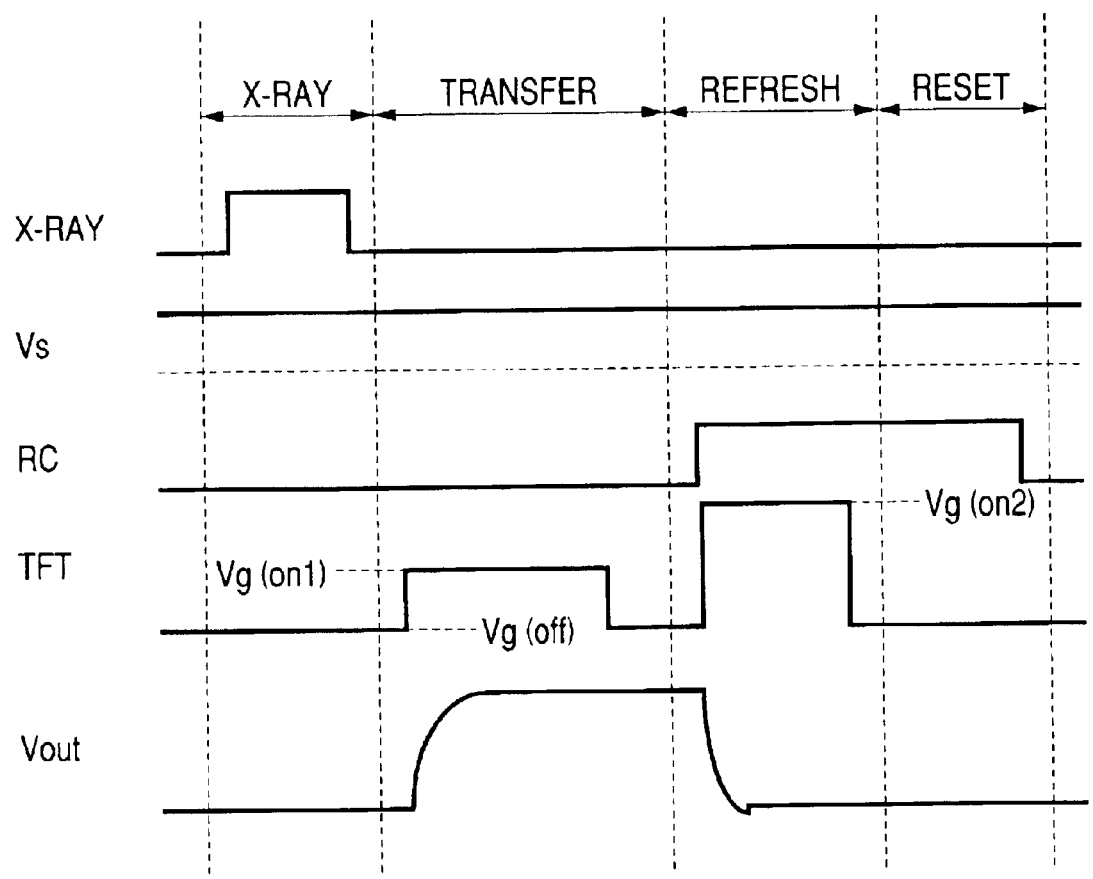
FIG. 2 is a time chart showing the operation of the circuit for one pixel shown in FIG. 1.

FIG. 2 is a time chart showing the operation of the circuit for one pixel shown in FIG. 1.

The operation of the circuit for one pixel, constituted by the photoelectric conversion device and the TFT, will be described with reference to FIGS. 1 and 2.

Description will first be made of an X-ray irradiation period. X-rays are emitted in a pulsating manner, as illustrated. The phosphor 1001 is irradiated with X-rays which have passed through a subject. The phosphor 1001 converts the X-rays into visible light. The visible light from the phosphor is radiated to the semiconductor layer (i-layer) to be converted into an electric signal by photoelectric conversion. Hole carriers produced by photoelectric conversion are accumulated at the interface between the i-layer and the insulating layer (injection device layer) to increase the potential at the node N. Since the TFT is off, the potential at the G-electrode side is correspondingly increased. In the X-ray irradiation period, the SW-D is set for connection at the V(off) side and the SW-C is off.

Description will next be made of a transfer period. A transfer operation is performed as described below. The SW-D is operated to enable the TFT to be turned on, and the SW-E is set for connection at the Vg(on2) side, thereby turning on the TFT. Electron carriers ($S_e$) corresponding to the amount of hole carriers ($S_h$) accumulated by X-ray irradiation are thereby caused to flow from the C2 side to the G-electrode side through the TFT, thereby increasing the potential at the read capacitance C2. The relationship between $S_e$ and $S_h$ is as expressed by $S_e = S_h \cdot C_{SiN}/(C_{SiN}+C_i)$. Simultaneously, the potential at the C2 is amplified by an amplifier to be output. The TFT is maintained in the on state for a time long enough to transfer a sufficient amount of signal charge and is thereafter turned off.

A refresh operation will now be described.

Figure 3:
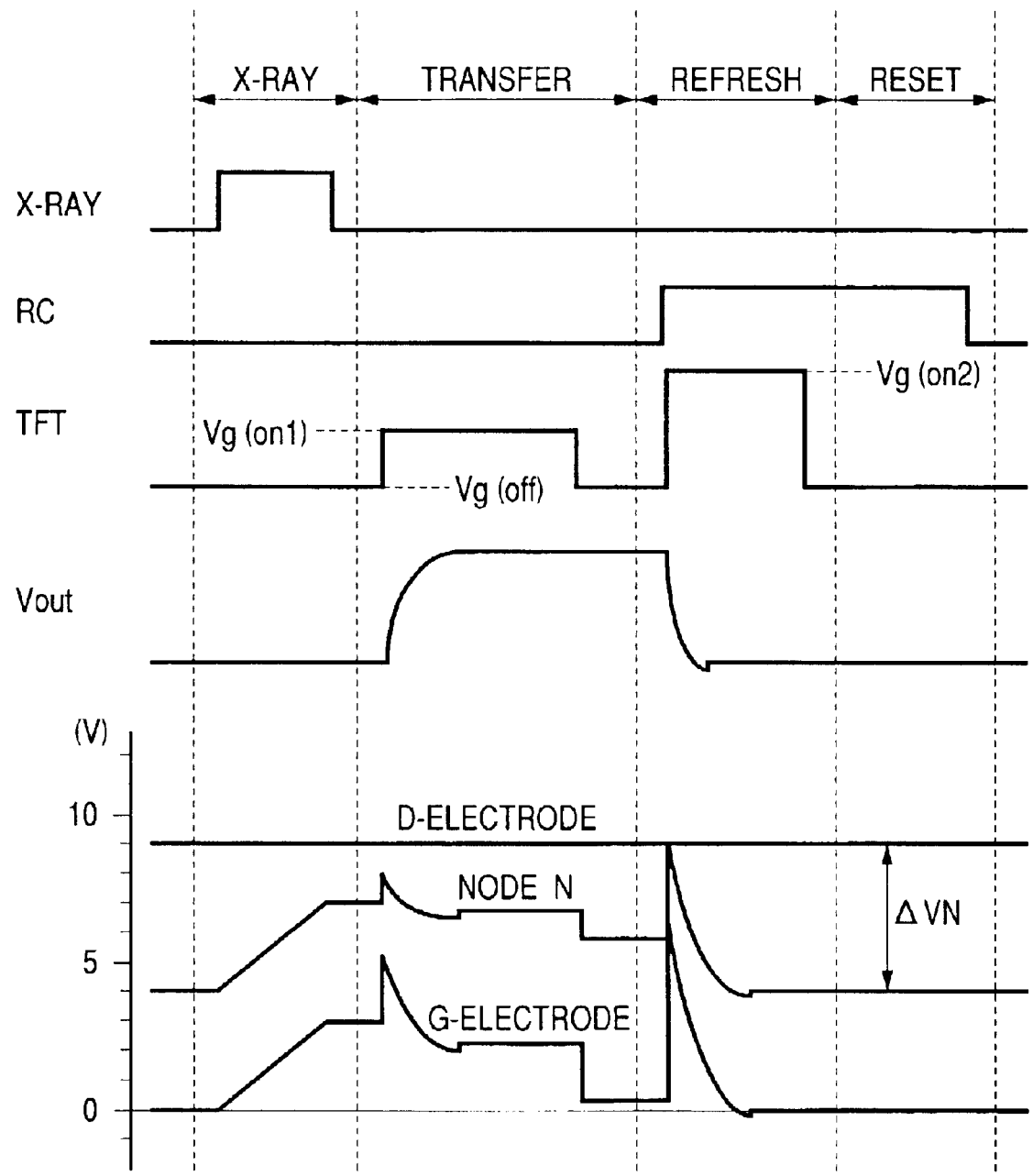
FIG. 3 is a time chart showing potentials at a node N, a G-electrode, and a gate electrode of a TFT in the photoelectric conversion device shown in FIG. 1 in a refresh period.

FIG. 3 is a time chart showing the potentials at the node N, the G-electrode and the gate electrode of the TFT.

The operation will be described by way of example by assuming that Vs=9(V), Vg(off)=−5(V), Vg(on1)=12(V), and Vg(on2)=30(V).

To start the refresh operation, the SW-D is operated to enable the TFT to be turned on, the SW-E is set for connection at the Vg(on1) side, and the SW-C is turned on. When a potential difference of DV=35(V) is given to increase the gate bias for the TFT from Vg(off)=−5(V) to Vg(on1)=30(V), the charge is instantaneously distributed by the application of the 35V bias to the capacitances Cg, $C_{SiN}$, and $C_i$ (charge sharing). The increase in potential at the G-electrode and the increase in potential at the node N are determined by the capacitances Cg, $C_{SiN}$, and $C_i$. However, the potential at the node N does not exceed 9V since the diode D1 exists. When a voltage, e.g., Vg(on1) is applied such as to increase the potential at the node N above 9V, hole carriers are caused to move toward the D-electrode side for refreshment while the node N potential is maintained at 9V. The potential at the G-electrode once increased by charge sharing attenuates thereafter to the GND potential with a time constant determined by the on resistance Ron of the TFT and the capacitance of the photoelectric conversion device (($C_{SiN}$//$C_i$): the total capacitance of series capacitances $C_{SiN}$ and $C_i$). Simultaneously, the potential at the node N also attenuates, as does that at the G-electrode. An attenuation amount DVN of the node N with respect to an attenuation amount DVG of the G-electrode is as expressed by DVN/DVG=$C_{SiN}$/($C_{SiN}$/($C_{SiN}$+$C_i$). The amount of attenuation DVN of the potential at the node N determines the amount of hole carriers accumulated by the next photoelectric conversion operation. The potentials at the node N, the G-electrode and the gate electrode of the TFT are shown in the time chart of FIG. 3.

Finally, a reset operation will be described. To start the reset operation, the switch SW-C is turned on. The capacitance C2 is thereby reset to the GND potential, thus preparing for the next transfer operation.

Figure 17:
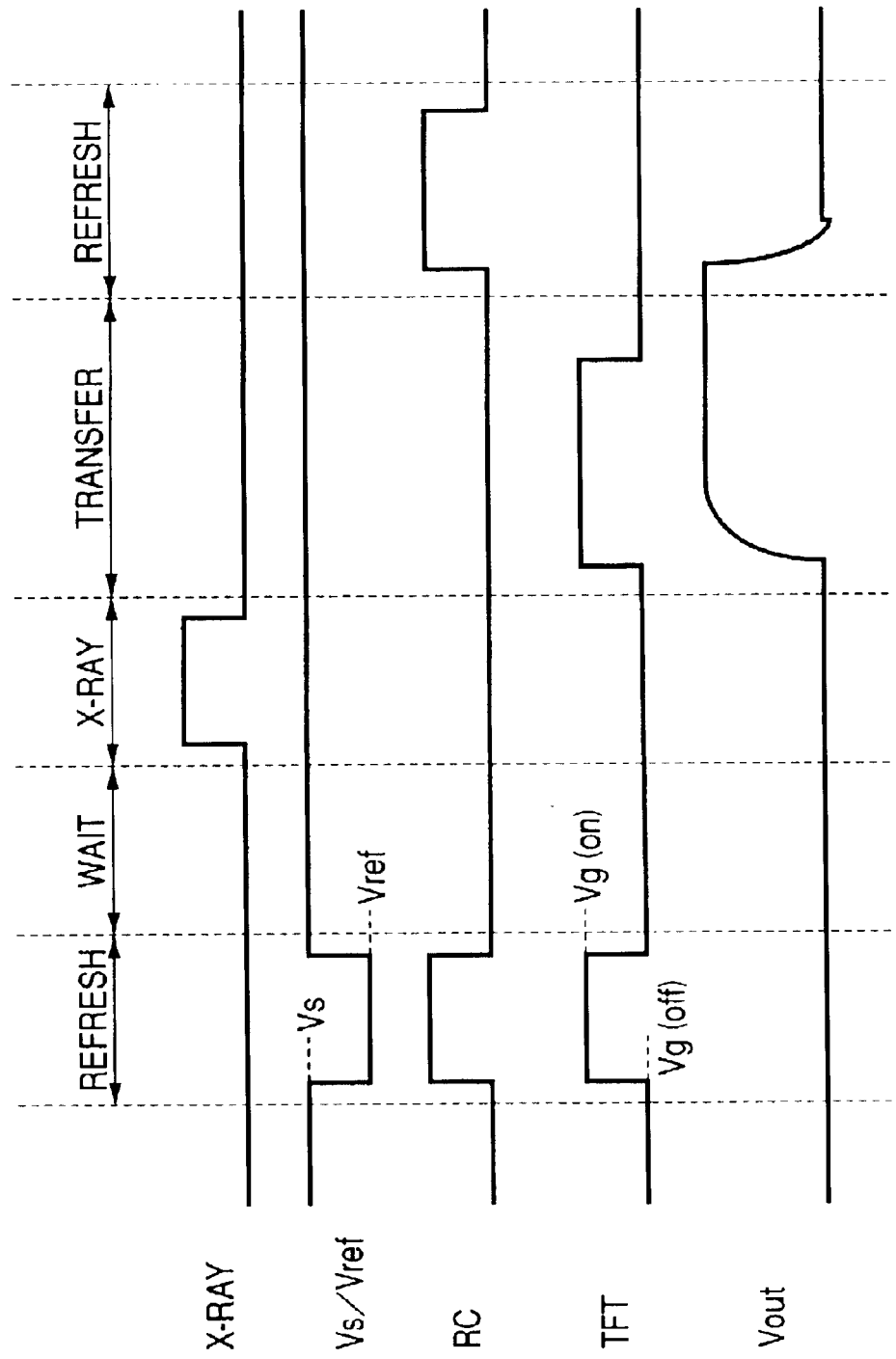
FIG. 17 is a time chart showing the operation of the circuit corresponding to one pixel shown in FIG. 16.
Figure 18:
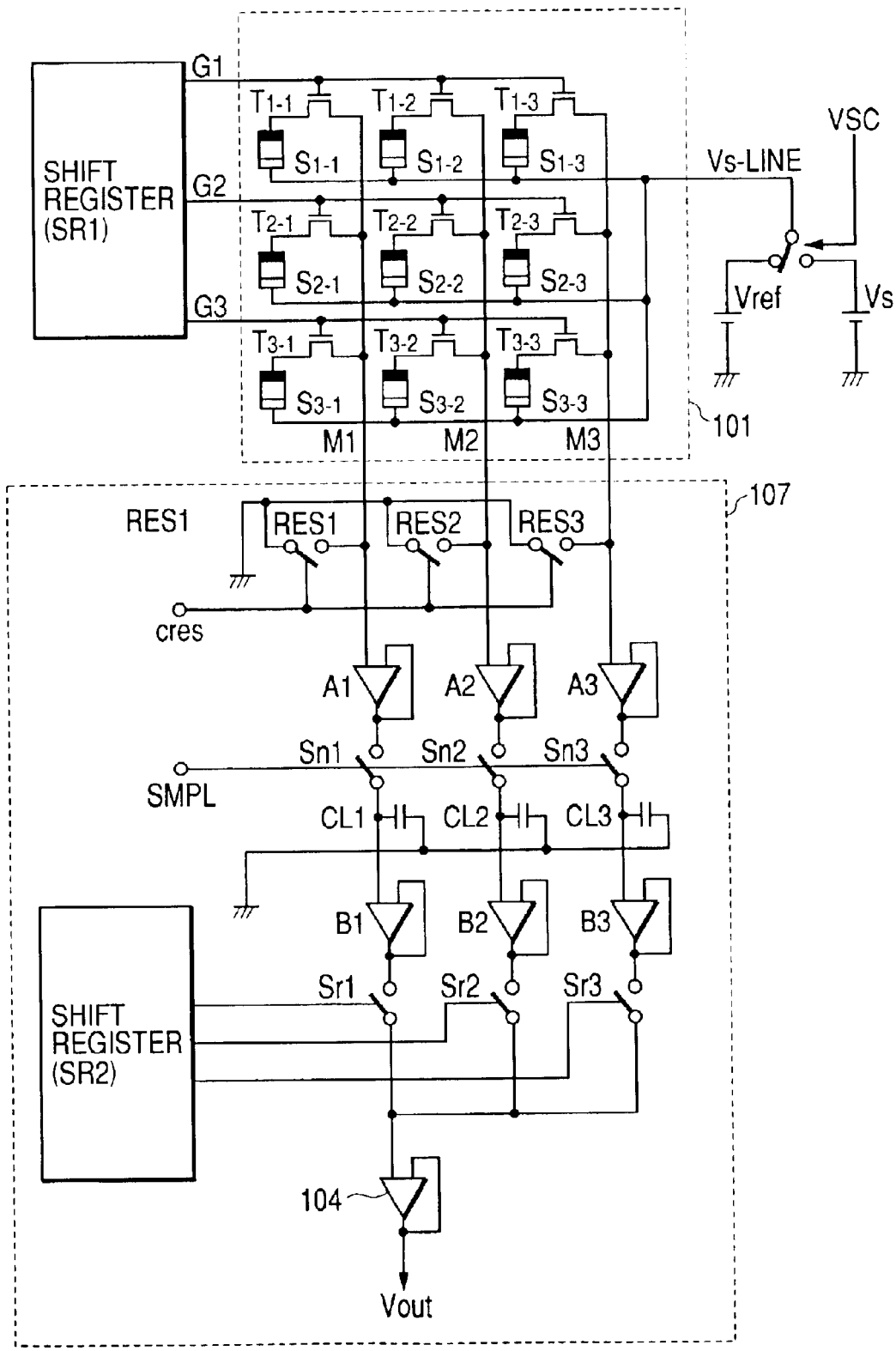
FIG. 18 is a two-dimensional circuit diagram of a photoelectric conversion circuit section included in the conventional X-ray image pickup apparatus.

No wait period corresponding to that shown in FIG. 17 is shown in FIG. 2. The reason therefor will be described below with reference to FIGS. 3 and 4.

Figure 4:
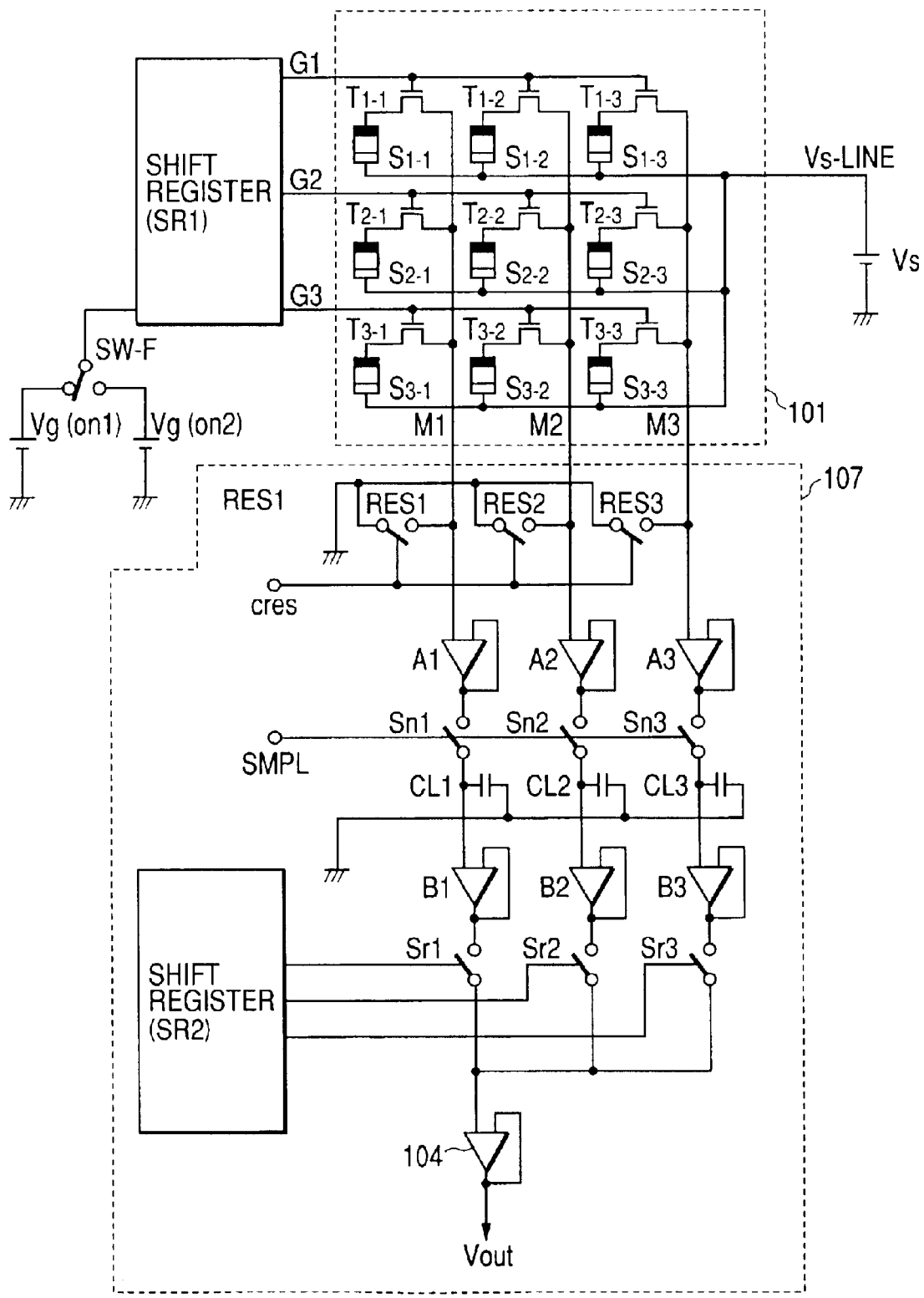
FIG. 4 is a two-dimensional circuit diagram of a photoelectric conversion circuit section included in the X-ray image pickup apparatus representing the first embodiment of the present invention.

FIG. 4 is a two-dimensional circuit diagram of a photoelectric converter included in the X-ray image pickup apparatus of the first embodiment of the present invention. Only a portion of the converter corresponding to 3'3=9 pixels is illustrated for ease of description. Photoelectric conversion devices are indicated by S1-1 to S3-3; switching devices (TFTs) are indicated by T1-1 to T3-3; gate wirings for turning on and off the TFTs are indicated by G1-1 to G3-3; and signal wirings are indicated by M1 to M3. A Vs-line is a wiring for applying a storage bias to the photoelectric conversion devices. Electrodes of the photoelectric conversion devices represented by solid filled rectangles are G-electrodes, while electrodes at the opposite side are D-electrodes. Portions of the Vs-line are used for the D-electrodes. For convenience in enabling entrance of light, a thin N$^+$-layer is used to form the D-electrodes. To improve the entrance efficiency, a transparent electrode made of indium-tin oxide (ITO) for example may be used. The group of components: S1-1 to S3-3, T1-1 to T3-3, G1 to G3, M1 to M3, and the Vs-line will be referred to collectively as a photoelectric conversion circuit section (101). The Vs-line is biased by a Vs power supply 106A. A shift register 102 is provided to supply a drive pulse voltage to the wirings G1 to G3. The voltage for turning on the TFTs is externally supplied. For this voltage supply, two external power supplies VG(on1) and VG(on2) are used by being selected with a switch SW-E. The voltage is applied by successively changing the application line to perform the row-by-row refresh operation. A read circuit section 107 is provided in which parallel signal outputs from the wirings M1 to M3 in the photoelectric conversion circuit section 101 are amplified and converted into a serial signal to be output. Preferably, a read circuit includes IC chips to realize a high speed processing. In the read circuit section 107 are provided switches RES1 to RES3 for resetting M1 to M3, amplifiers A1 to A3 for amplifying signals from M1 to M3, sample and hold capacitors CL1 to CL3 for temporarily storing the signals amplified by the amplifiers A1 to A3, switches Sn1 to Sn3 for sampling and holding, buffer amplifiers B1 to B3, switches Sr1 to Sr3 for converting parallel signals into a serial signal, a shift register 103 for supplying pulses for parallel-to-serial conversion to the switches Sr1 to Sr3, and a buffer amplifier 104 for outputting the converted serial signal.

Figure 5:
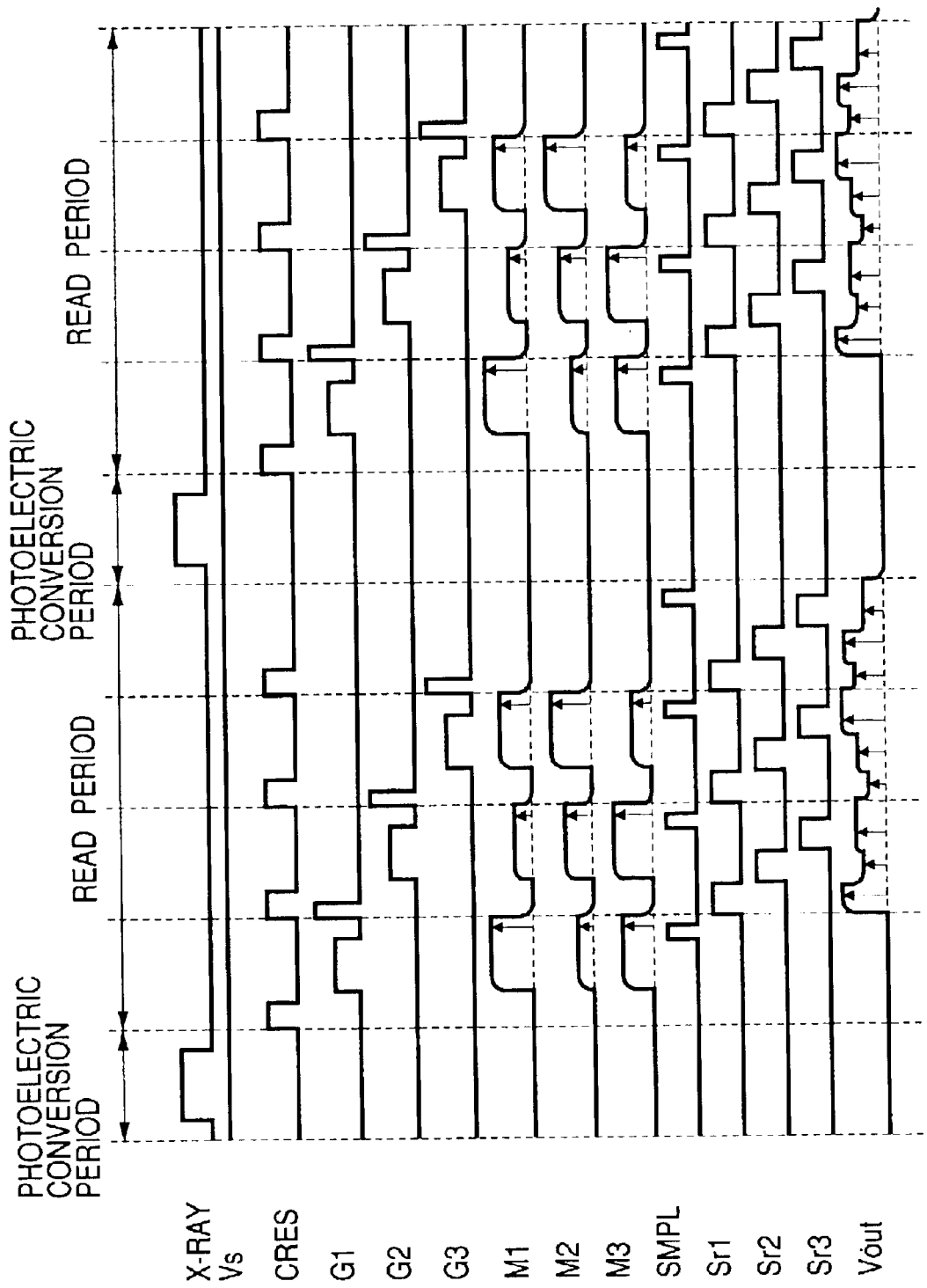
FIG. 5 is a time chart showing the operation of the photoelectric converter shown in FIG. 4.

FIG. 5 is a time chart showing the operation for two frames of the photoelectric converter shown in FIG. 4.

The operation of the photoelectric converter shown in FIG. 4 will be described with reference to the time chart of FIG. 5.

Description will first be made of a photoelectric conversion period. The D-electrodes of all the photoelectric conversion devices are in a state of being biased at the read power supply voltage VS (positive potential). All the signals from the shift register 102 are "Lo" and all the switching TFTs (T1-1 to T3-3) are off. When in this state a light source is turned on in an pulsating manner, each photoelectric conversion device is irradiated with light and electron and hole carriers are produced in the i-layer of the photoelectric conversion device. Electrons are caused by Vs to move toward the D-electrode, while holes are accumulated at the interface between the i-layer and the insulating layer in the photoelectric conversion device and are maintained even after turning-off of the X-ray source.

Description will next be made of a read period.

A read operation is performed in the order of the first line corresponding to S1-1 to S1-3, the second line corresponding to S2-1 to S2-3, and the third line corresponding to S3-1 to S3-3. First, to read first-line signals from S1-1 to S1-3, the shift register SR1 supplies a gate pulse to the gate wiring G1 connected to the switching devices (TFTs) T1-1 to T1-3. The high level of the gate pulse supplied at this time is the voltage Vg(on2), which is externally supplied. The TFTs T1-1 to T1-3 are thereby turned on and signal charges accumulated in S1-1 to S1-3 are transferred to the signal wirings M1 to M3. Read capacitances (not shown in FIG. 4) are added to the signal wirings M1 to M3 and the signal charges are transferred to the read capacitances via the TFTs. For example, the read capacitance added to the signal wiring M1 is the sum of the gate-source interelectrode capacitances (Cgs) (three capacitances) of the TFTs T1-1, T2-1, and T3-1 connected to the signal wiring M1, and corresponds to C2 shown in FIG. 1. The signal charges transferred to the signal wirings M1 to M3 are amplified by the amplifiers A1 to A3. Then the signal CRES is turned on to transfer the charges to the sample and hole capacitors CL1 to CL3. When the signal CRES is turned off, the transferred charges are held on the capacitors CL1 to CL3. Subsequently, the shift register 103 applies a pulse to the switches Sr1, Sr2, and Sr3 so that the switches receive the pulse one after another in the order of Sr1, Sr2, and Sr3. The signals held on the capacitors CL1 to CL3 are then output from the amplifier 104 in the order of CL1, CL2, and CL3. Consequently, the signals obtained by photoelectric conversion from S1-1, S1-2, and S1-3 for the first line are successively output. The operation for reading second-line signals from S2-1 to S2-3, and the operation for reading third-line signals from S3-1 to S3-3 are performed in the same manner.

If signals on the wirings M1 to M3 are sampled and held on CL1 to CL3 by using the first-line sample signals, the signals from S1-1 to S1-3 are output from the photoelectric conversion circuit section 101. Therefore, while parallel-to-serial conversion is being performed by the switches Sr1 to Sr3 in the read circuit section 107, the operation for refreshing S1-1 to S1-3 and the operation for resetting the wirings M1 to M3 in the section 101 can be performed.

The operation for refreshing S1-1 to S1-3 is performed as described below. The switches RES1 to RES3 are turned on by the signal CRES to apply the voltage Vg(on1) to the gate wirings to the TFTs. The voltage Vg(on1) is set higher than the voltage Vg(on2). Thereafter, while the switches RES1 to RES3 are maintained in the conductive state, the TFTs are turned off to reset the read capacitances of the signal wirings M1 to M3 to the GND potential. After resetting of the wirings M1 to M3, the gate pulse can be applied to the line G2. That is, while parallel-to-serial conversion of the first-line signals is being performed by the shift register SR2, refreshment of the photoelectric conversion devices S1-1 to S1-3 in the photoelectric conversion circuit section 101, resetting of the wirings M1 to M3 and transfer of signal charges on the second-line photoelectric conversion devices S2-1 to S2-3 to the wirings M1 to M3 with the shift register SR1 can be simultaneously performed.

Signal charges on all the first-line to third-line photoelectric conversion devices can be output by the above-described operation.

It is possible to obtain a series of moving images by repeating a process of the above-described photoelectric conversion period and read period. As shown in the timing chart of this embodiment, the refreshment period is not independently set, so that the frame frequency set in the case of obtaining moving images can be effectively increased. The conventional method of refreshing all the photoelectric conversion devices at a time requires setting of a wait period for reducing fluctuations of the GND and the power supplies due to dark current components generated at the time of refreshment. In contrast, in this embodiment, line-by-line refreshment is performed. Therefore, the number of photoelectric conversion devices to be refreshed at a time is much smaller and there is no need to specially set a wait period, which means that the moving image frame frequency can be increased.

Embodiment 2

Figure 6:
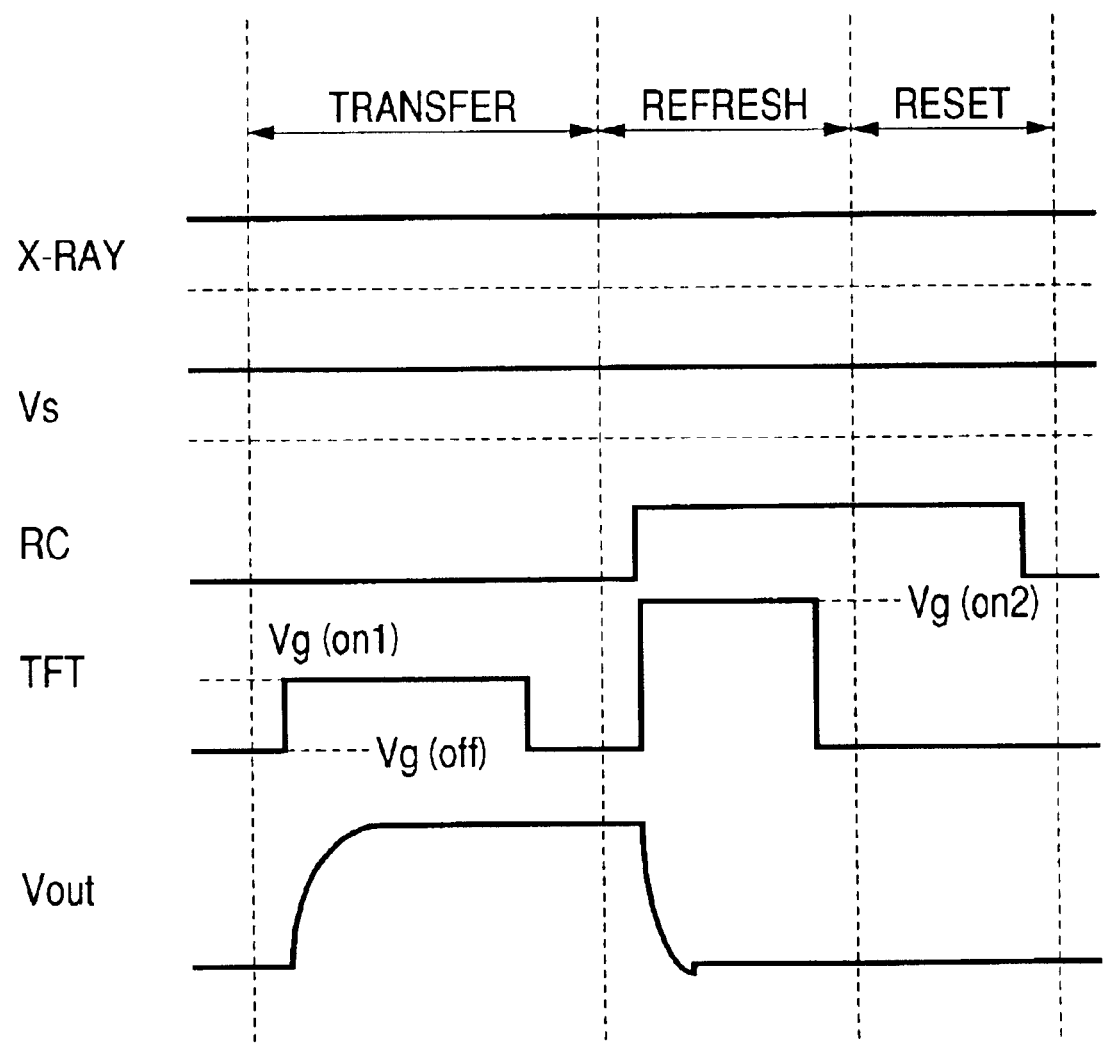
FIG. 6 is a time chart showing drive in an X-ray image pickup apparatus which represents a second embodiment of the present invention.

FIG. 6 is a time chart showing drive in an X-ray image pickup apparatus which represents a second embodiment of the present invention. While the time chart of FIG. 2 shows the method of radiating X-rays in a pulsating manner, the time chart of FIG. 6 shows a method of radiating X-rays at a constant intensity. In this case, a photoelectric conversion period is defined between a time at which refreshment is completed and a time at which transfer is started. An actual X-ray image pickup apparatus for medical use has a large number of pixels (N rows'M columns). For example, the photoelectric conversion devices in the first row have a photoelectric conversion period substantially equal to the sum of the periods for read of the second to Nth lines, i.e., N−1 lines except the periods for transfer, refreshment and resetting performed in themselves. The photoelectric conversion devices in each of the other rows have a photoelectric conversion period determined in the same manner, i.e., the sum of the periods for read of N−1 lines except the periods for transfer, refreshment and resetting performed in themselves. For example, the photoelectric conversion devices in the 100th line have a photoelectric conversion period substantially equal to the sum of the periods for read of the 101st to Nth lines and the periods for read of the 1st to 99th lines in the next frame, i.e., the periods for read of N−1 lines. That is, in this embodiment characterized by radiating X-rays at a constant intensity, the photoelectric conversion period may extend one frame to another. However, all the photoelectric conversion devices have the same photoelectric conversion period and no unusual condition results.

In this embodiment, the X-ray irradiation period, i.e., the photoelectric conversion period shown in FIG. 2 or 5, can be removed, so that the frame rate can be further increased advantageously. Also, in comparison with the pulsating radiation method, the intensity of X-rays can be reduced to lighten the burden on the X-ray source tube and the power supply.

Embodiment 3

Figure 7:
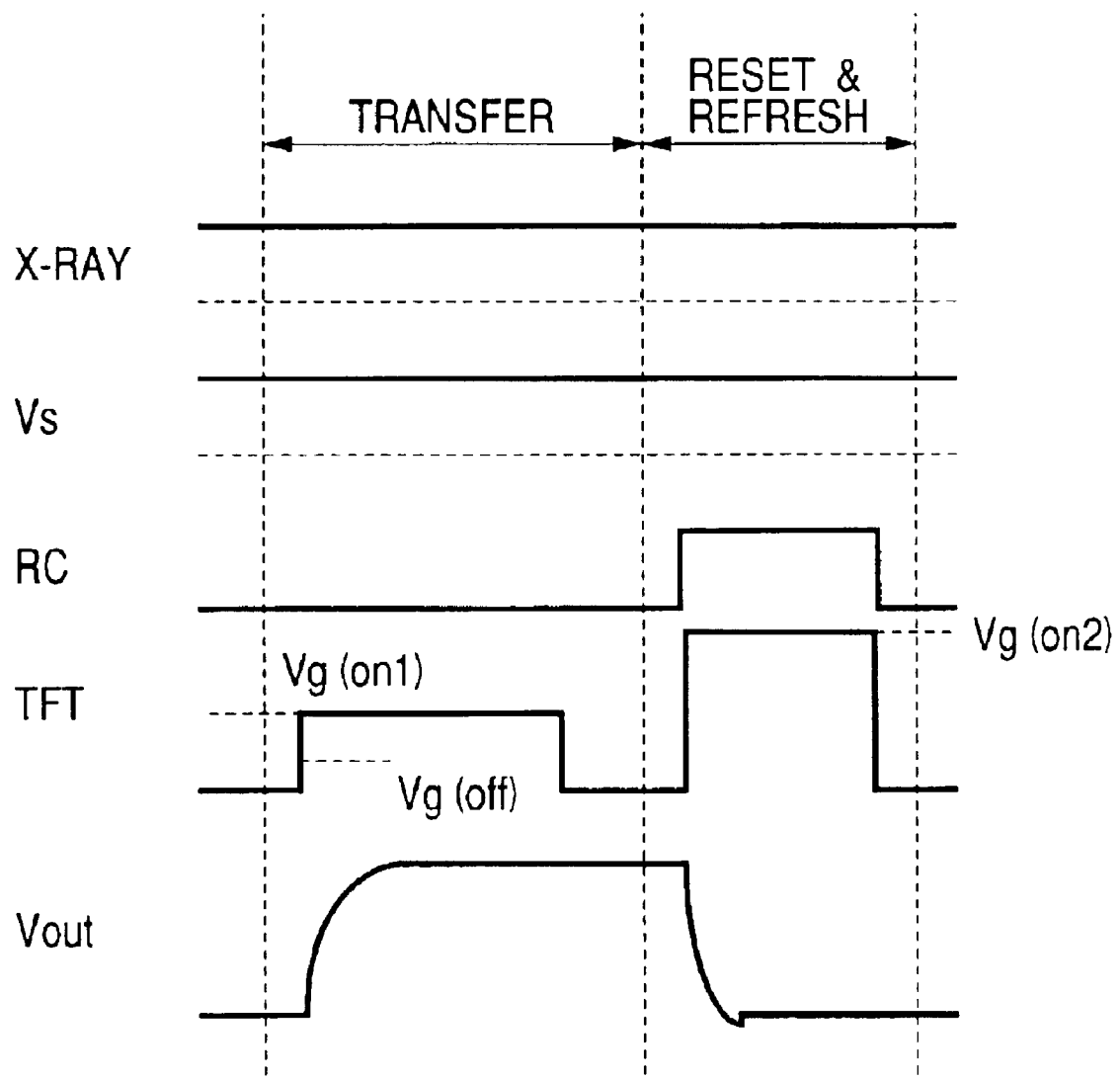
FIG. 7 is a time chart showing drive in an X-ray image pickup apparatus which represents a third embodiment of the present invention.

FIG. 7 is a time chart showing drive in an X-ray image pickup apparatus which represents a third embodiment of the present invention. While in the embodiment shown in the time chart of FIG. 6 the wirings M1 to M3 are reset after refreshment of the photoelectric conversion devices, the photoelectric conversion device refresh operation and the operation for resetting the wirings M1 to M3 are simultaneously performed in the embodiment shown in FIG. 7. The necessary condition for the refresh operation is the same as that for the resetting operation and it is turning on the switch SW-C shown in FIG. 1 or the switches RES1 to RES3 shown in FIG. 4 by using the control signal CRES (control signal RC). Therefore the refresh operation and the resetting operation can be performed simultaneously with each other. Since X-rays are also radiated at a constant intensity in this embodiment, the photoelectric conversion devices in one row have a photoelectric conversion period substantially equal to the sum of the periods for read of −1 lines except the periods for transfer, refreshment and resetting performed in themselves, as in the second embodiment.

In this embodiment, the reset period shown in FIG. 6 can be removed, so that the frame rate can be further increased advantageously in comparison with the second embodiment. Also, in comparison with the first embodiment, the intensity of X-rays can be reduced to lighten the burden on the X-ray source tube and the power supply, as in the second embodiment.

Embodiment 4

Figure 8:
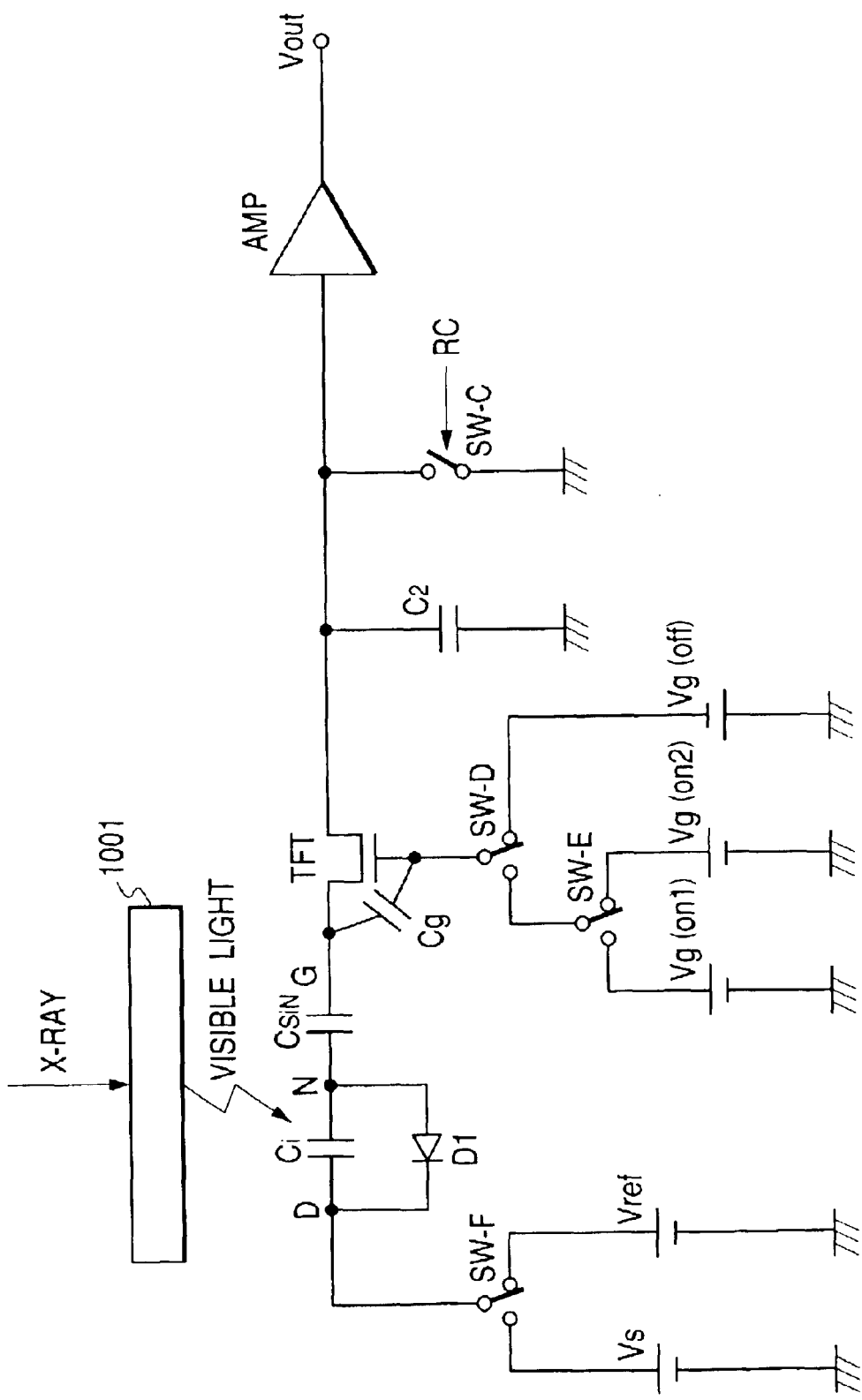
FIG. 8 is an equivalent circuit diagram of a portion, corresponding to one pixel, of an X-ray image pickup apparatus which represents a fourth embodiment of the present invention.
Figure 9:
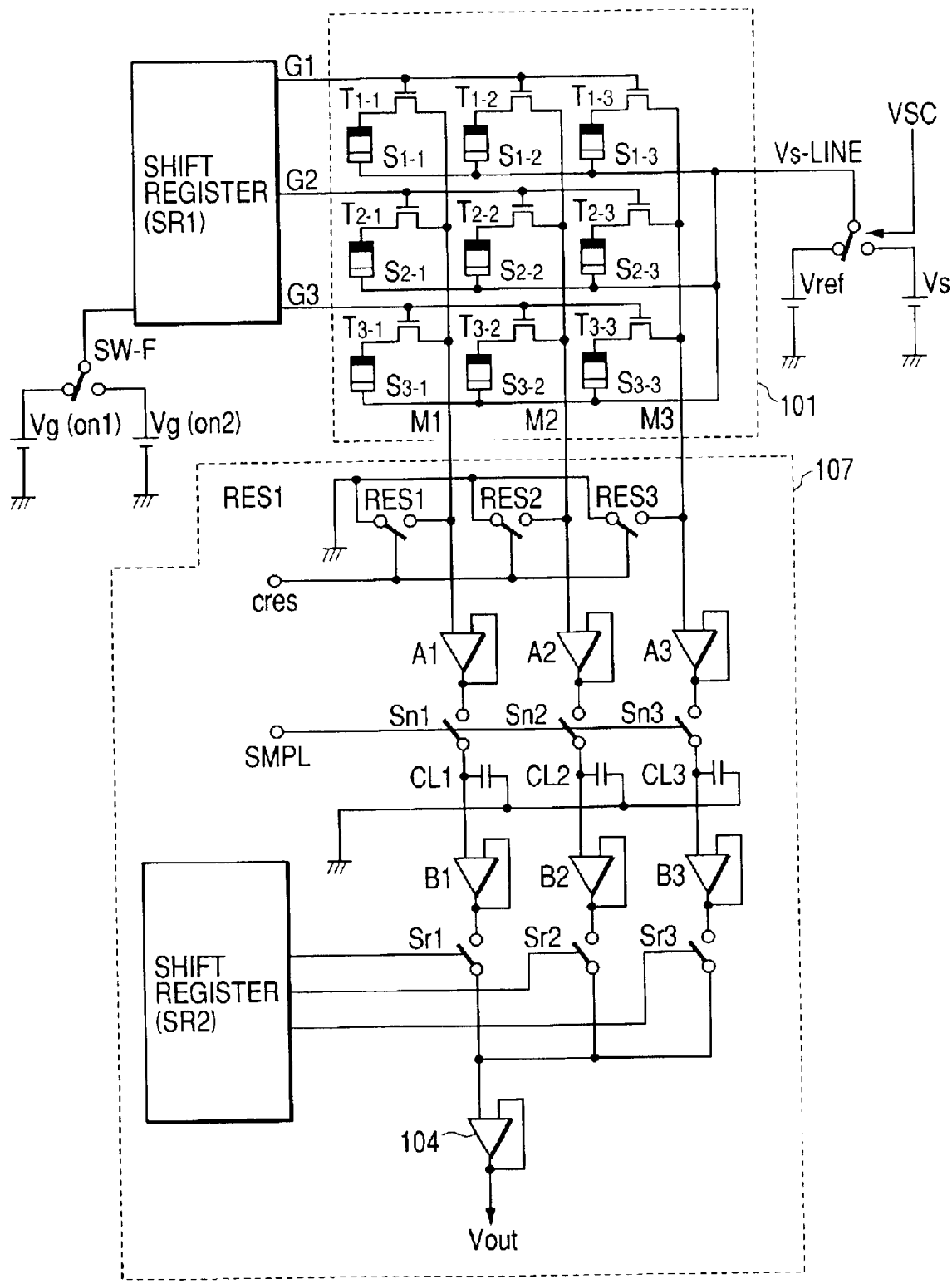
FIG. 9 is a two-dimensional circuit diagram of a photoelectric conversion circuit section included in the X-ray image pickup apparatus representing the fourth embodiment of the present invention.
Figure 10:
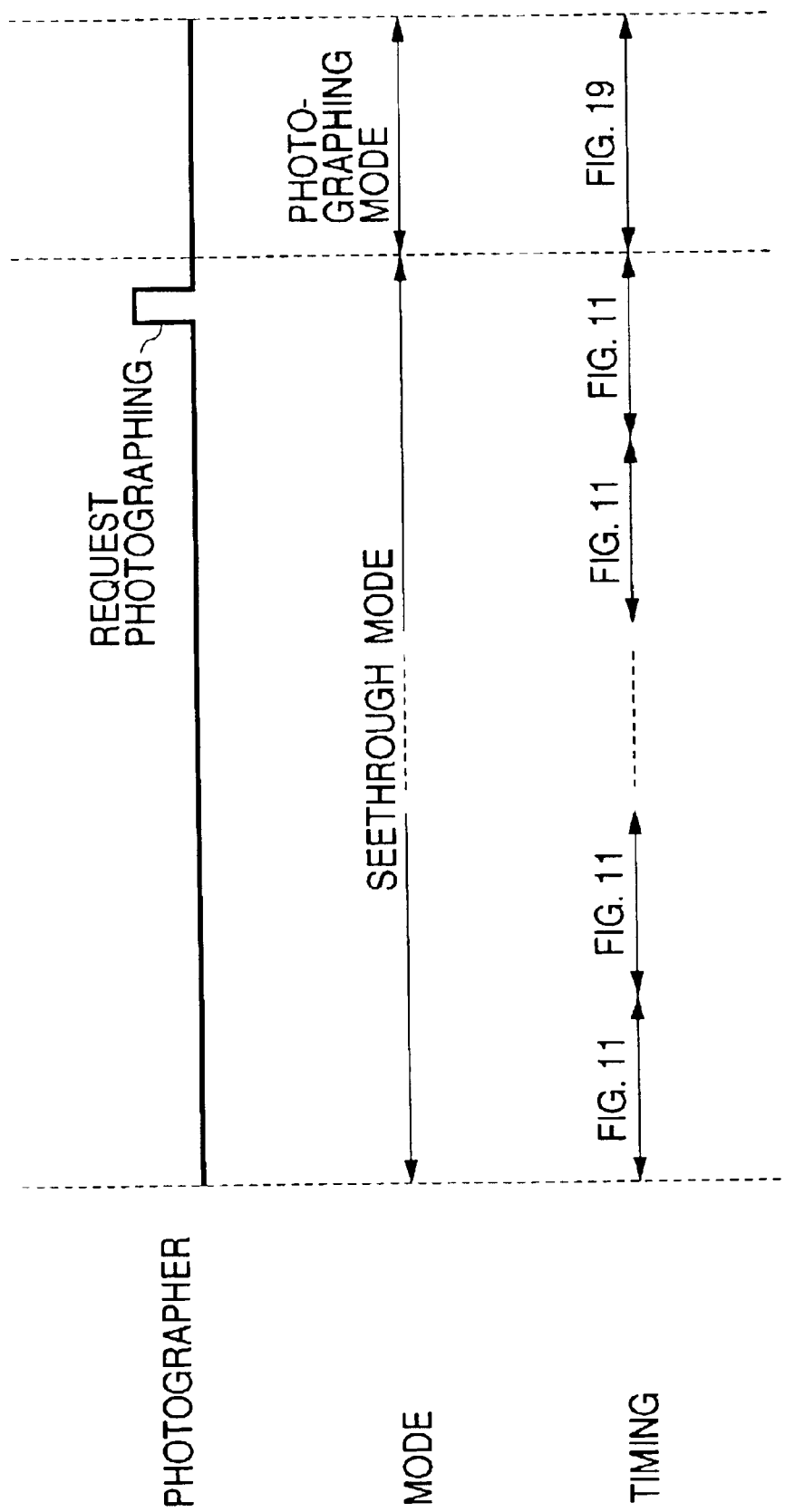
FIG. 10 is a schematic timing chart of a seethrough mode and a photographing mode in accordance with the fourth embodiment of the present invention.
Figure 11:
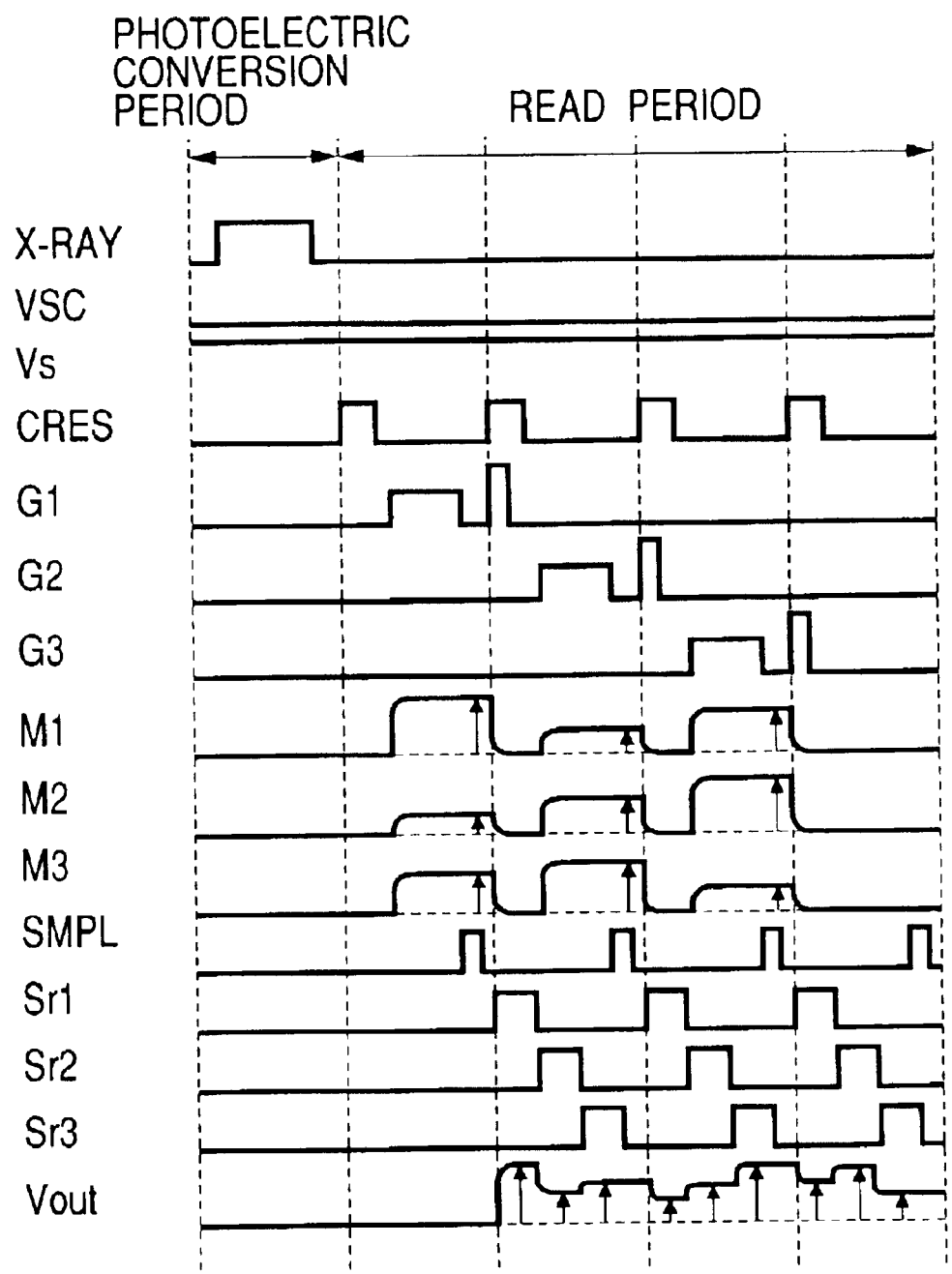
FIG. 11 is a timing chart of the seethrough mode shown in FIG. 10.
Figure 19:
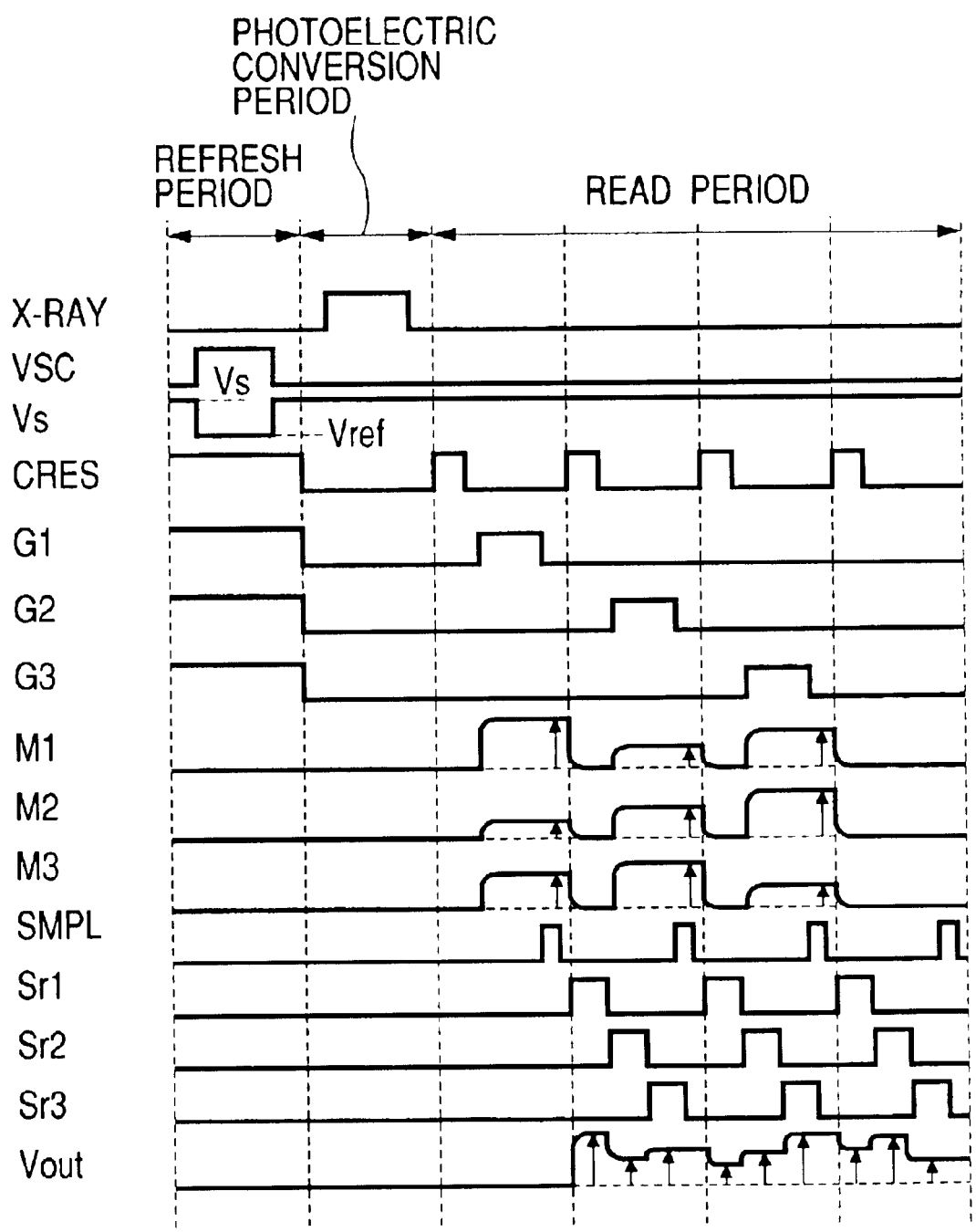
FIG. 19 is a time chart showing the operation of the photoelectric conversion circuit section shown in FIG. 18.

FIG. 8 is an equivalent circuit diagram of a portion, corresponding to one pixel, of an X-ray image pickup apparatus which represents a fourth embodiment of the present invention. While in the circuit shown in FIG. 1 the D-electrode of the photoelectric conversion device is biased at the constant voltage VS, the voltage VS and a voltage Vref can be selectively applied through a switch SW-F in the circuit shown in FIG. 8. This embodiment is characterized by enabling selection of photoelectric conversion device refresh voltage application from the G-electrode side or the D-electrode side. For example, in a case where one still image is to be taken, the method of applying the refresh bias from the D-electrode side is used to perform the operation, for example, shown in the time chart of FIG. 7. In a case where a plurality of still images are to be obtained, the method of applying the refresh bias from the G-electrode side is used to perform the operation, for example, shown in the time chart of FIG. 2. In this embodiment, photographing can be performed in each of a mode of taking a still image (photographing mode or still image mode) and a mode of obtaining moving images (seethrough mode or moving image mode) with one X-ray image pickup apparatus. FIG. 9 is a two-dimensional circuit diagram of the X-ray image pickup apparatus representing the fourth embodiment of the present invention. The circuit shown in FIG. 9 differs from the circuit shown in FIG. 4 in that the sensor bias line can be changed between the voltage VS and the voltage Vref by means of the control signal VSC. FIG. 10 is a schematic timing chart showing transition from a seethrough mode (moving image mode) to a photographing mode (still image mode) in photographing. FIG. 11 is a timing chart showing the operation in the seethrough mode of the circuit shown in FIG. 9. That is, in the seethrough mode, the timing operation shown in FIG. 10 is repeated. During the period for the seethrough mode, a photographer monitors a seethrough image of a subject (patient) to determine the position and angle of the subject to perform photographing of a still image. Ordinarily, the subject is irradiated with X-rays at a comparatively low dose rate during this period. When the photographer inputs an exposure request signal (a signal representing photographer's will to photograph a still image) to the apparatus, transition from the seethrough mode to the photographing mode is caused. The operating timing in the photographing mode is the same as that shown in FIG. 19. According to this embodiment, while biasing from the G-electrode side capable of line-by-line control is performed in a case where rapid refreshment such as that for obtaining moving images is required, biasing from the D-electrode side is performed in the case of photographing a still image. Advantageously, a high refresh voltage can be set if this biasing is performed, thereby ensuring a large dynamic range.

The succession of the seethrough mode and the photographing mode each set only one time as shown in FIG. 9 is not exclusively set. For example, the seethrough mode and the photographing mode may be alternately set repeatedly from the seethrough mode to the photographing mode, and returning to the seethrough mode and then the photographing mode, depending on the composition in which a subject is photographed.

Figure 12:
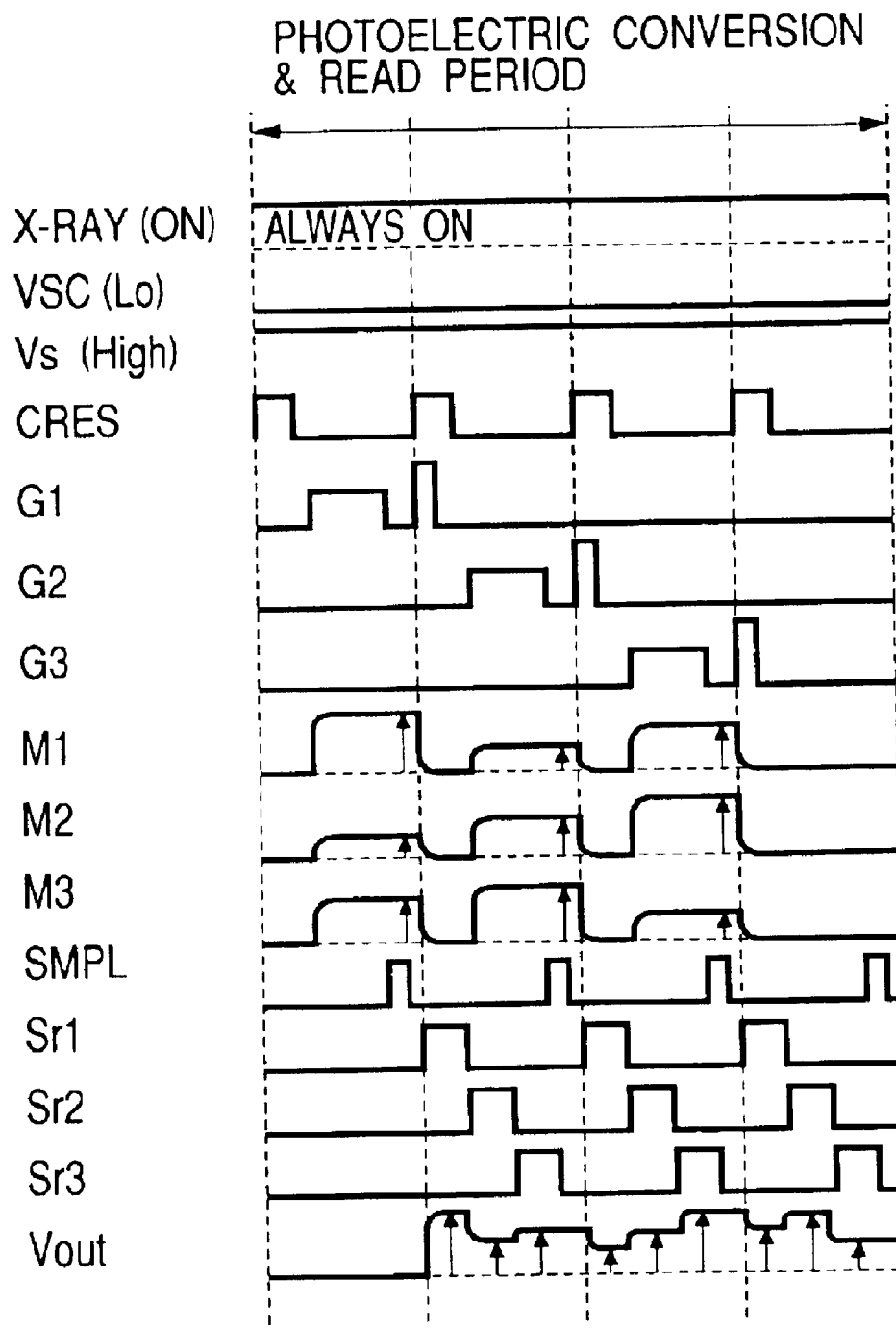
FIG. 12 is a timing chart of the seethrough mode shown in FIG. 10 (showing an example of timing different from that shown in FIG. 11)
Figure 13:
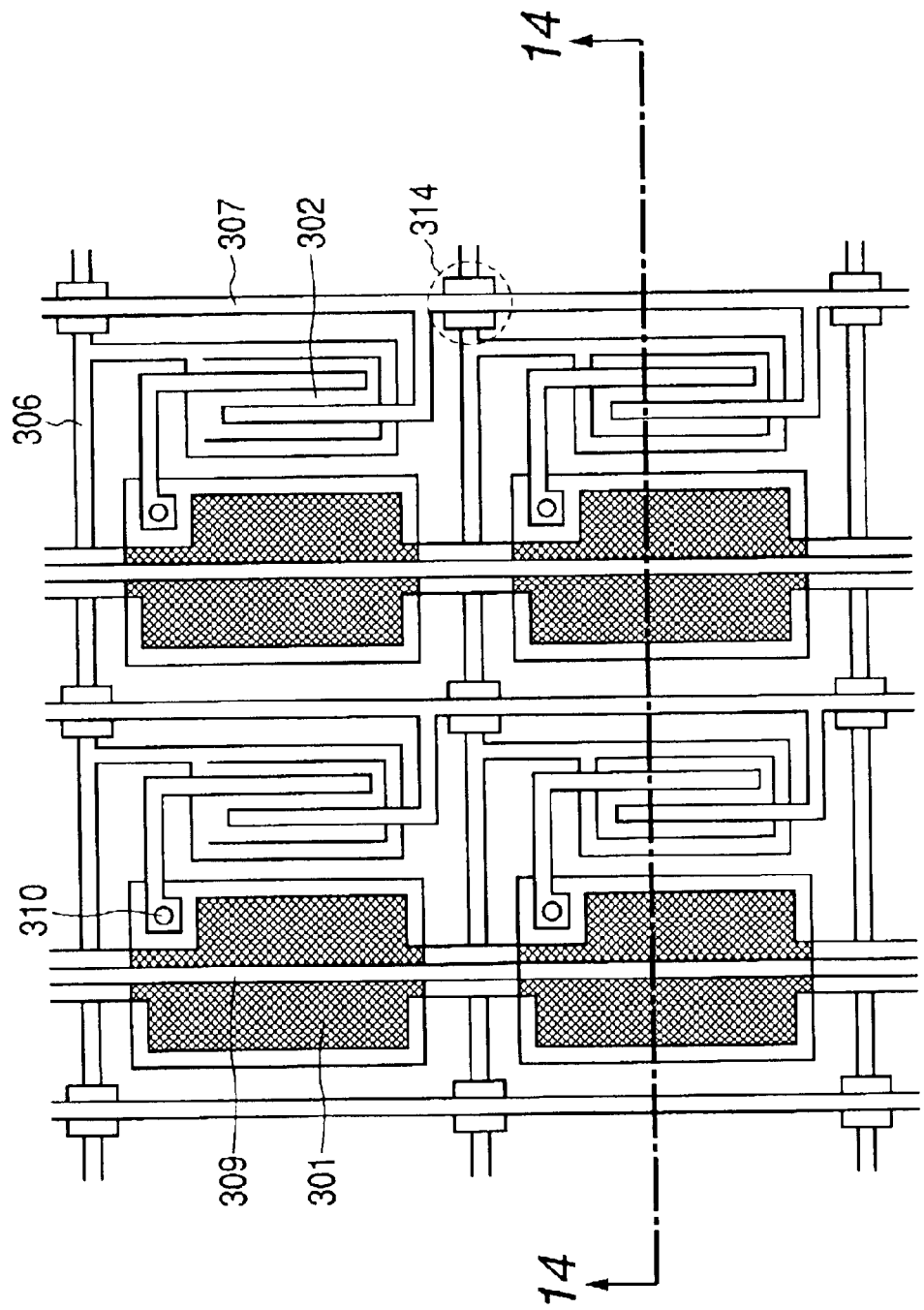
FIG. 13 is a top view of a conventional photoelectric converter structure in which photoelectric conversion devices and switching devices are formed on a substrate by using an amorphous silicon semiconductor thin film.
Figure 15A:
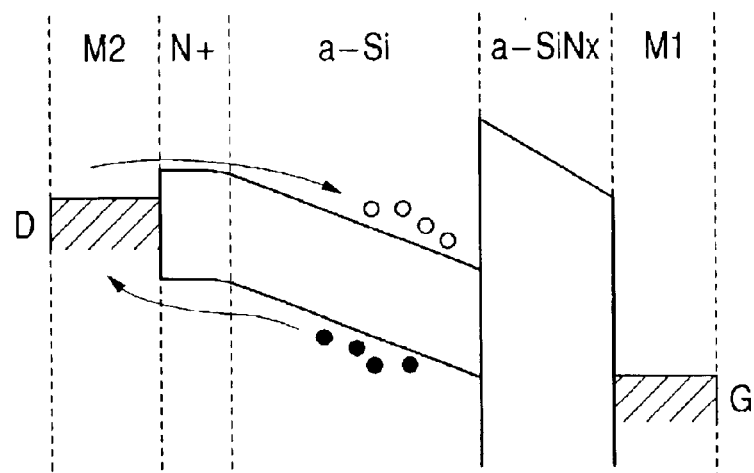
FIGS. 15A, 15B and 15C are an energy band diagram for explaining the device operation of the photoelectric conversion device shown in FIGS. 13 and 14.
Figure 15B:
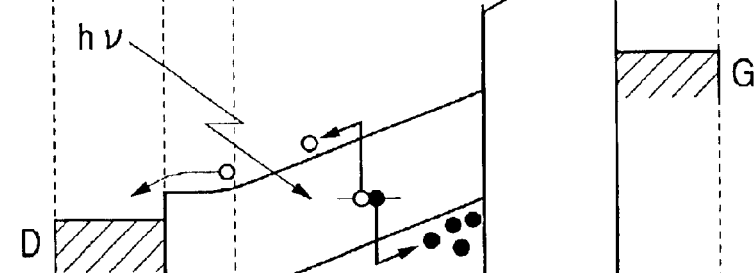
Figure 15C:
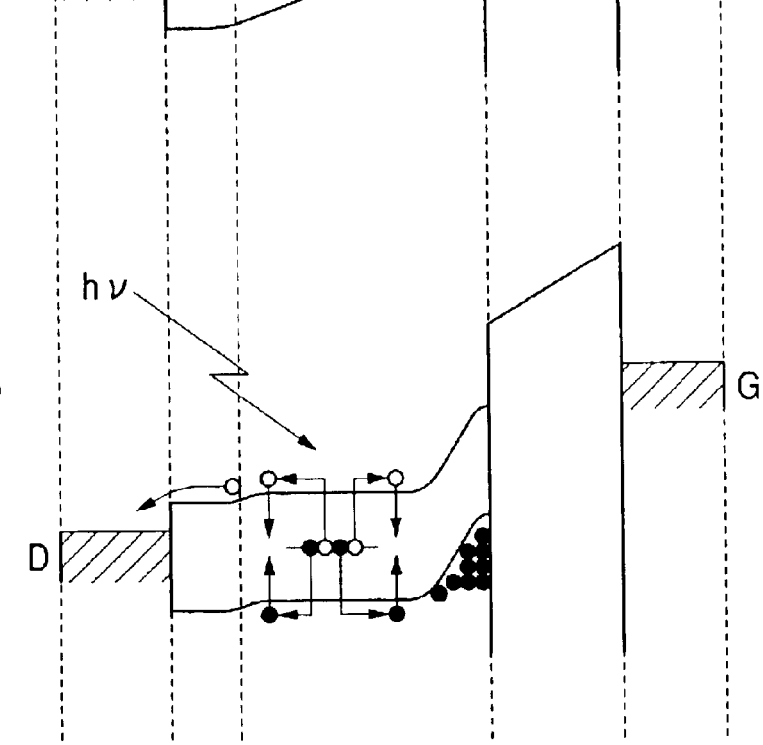
Figure 16:
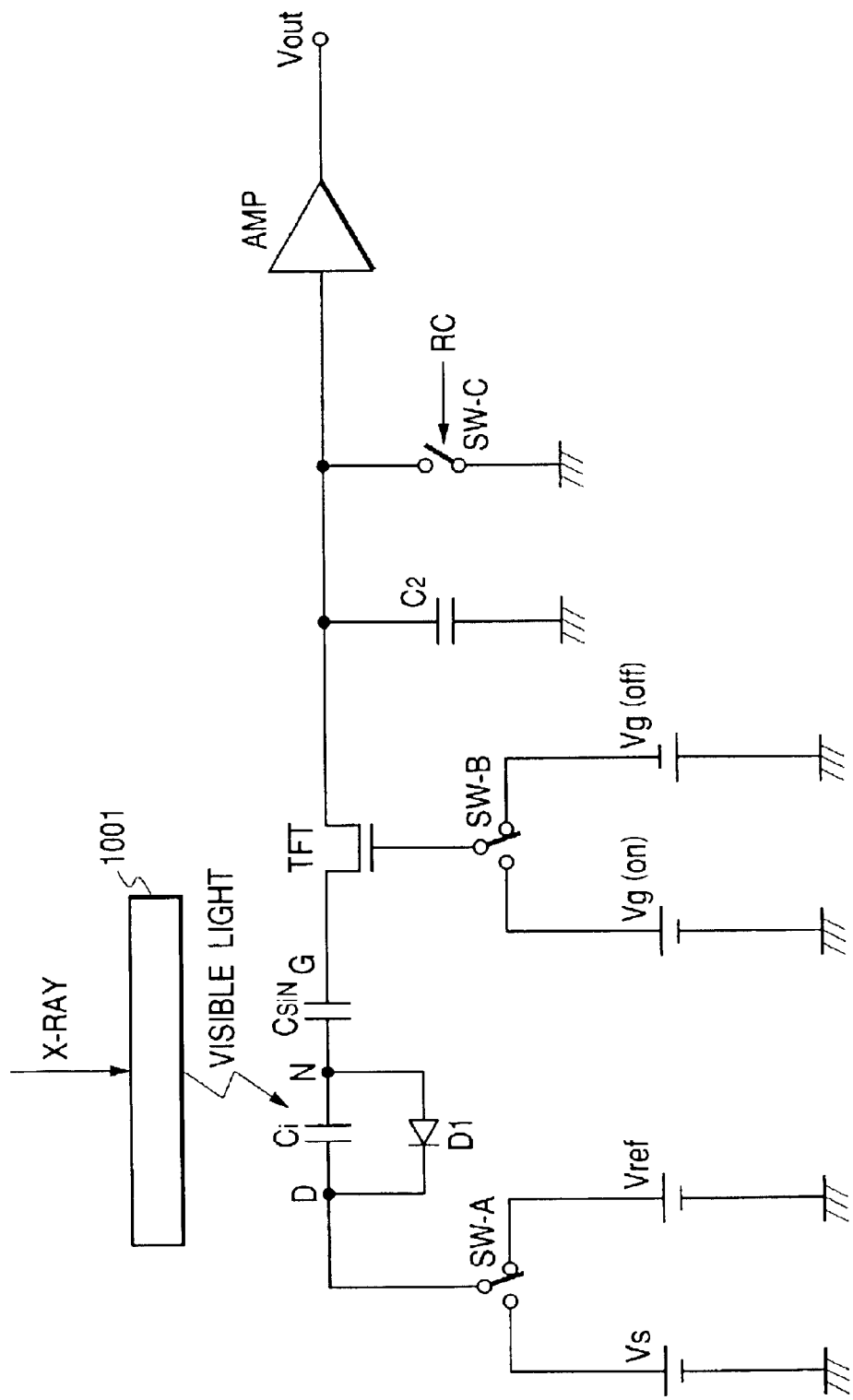
FIG. 16 is a circuit diagram of a portion, corresponding to one pixel, of a conventional photoelectric conversion circuit constituted by a photoelectric conversion device and a TFT.

FIG. 12 is a seethrough mode timing chart which differs from FIG. 11 in that X-rays are not radiated in a pulsating manner. In the case of timing shown in FIG. 12, the read period and the photoelectric conversion period can be concurrently set to enable the operating frequency in the transparent mode to be advantageously increased. Also, since the X-ray source is not operated so as to radiate X-rays in a pulsating manner, the load on the X-ray source can be reduced.

In a case where the present invention is applied to a seethrough apparatus, the arrangement may be such that, in the seethrough mode, a continuous image is obtained by performing refreshment from the TFT gate, and that, when transition to a still image photographing mode is made after the completion of seethrough positioning, refreshment from the SW-F side is performed to obtain a high S/N still image. Ordinarily, the refreshment efficiency of refreshment from the SW-F side is higher than that of refreshment from the TFT side, and the S/N achieved by the former is also higher. It is reasonable to use refreshment from the TFT gate in the case of photographing a seethrough positioning image which does not need to be high in S/N. Also, it is reasonable to use refreshment from the SW-F side in the case of photographing a still image which needs to be high in S/N and to have improved image quality.

Embodiment 5

Figure 20:
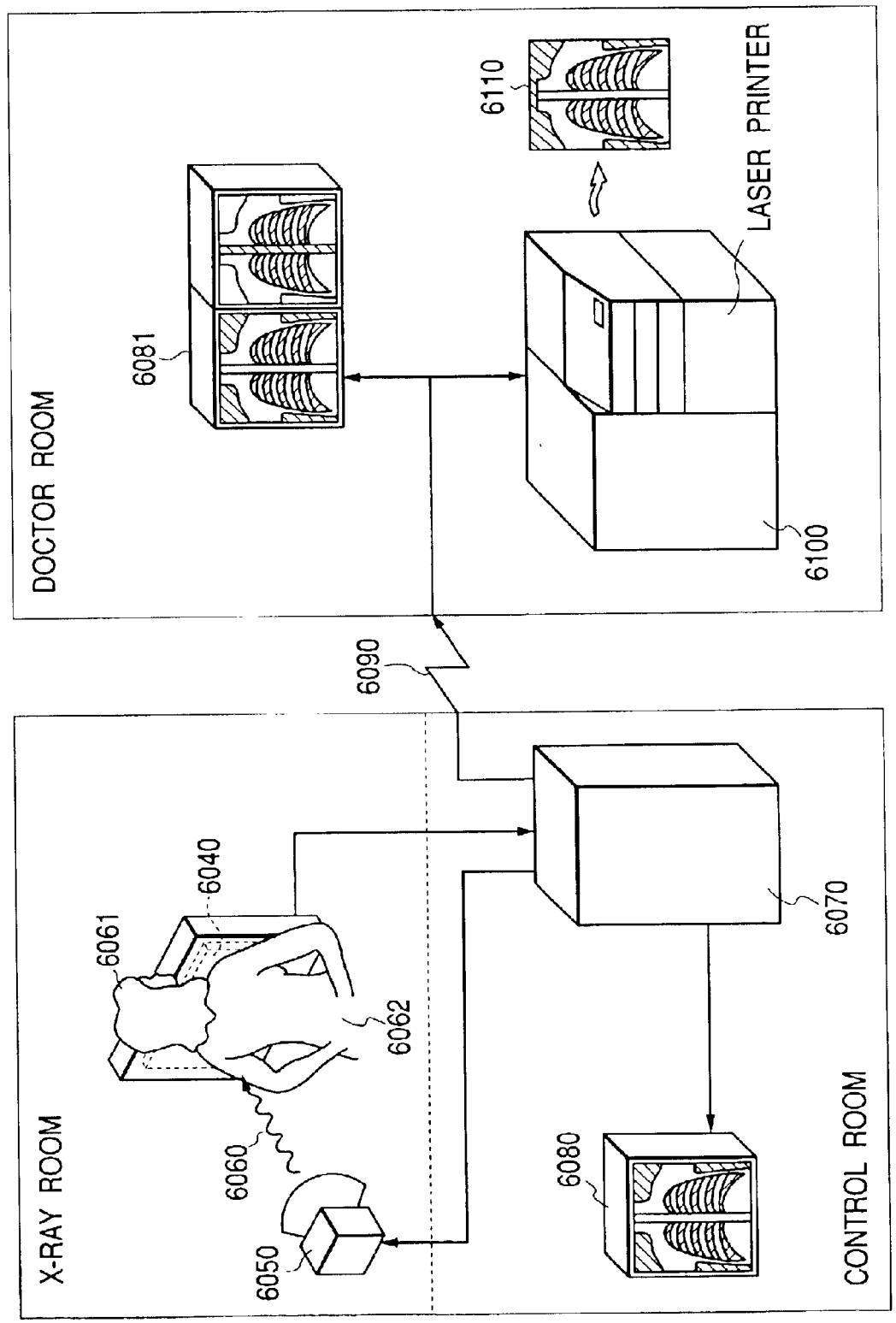
FIG. 20 is a diagram showing an application of an X-ray image pickup system which represents a fifth embodiment of the present invention.

FIG. 20 shows an example of application of the present invention to an X-ray diagnosis system using a radiographic image pickup apparatus.

X-rays 6060 generated in an X-ray tube 6050 pass through a breast 6062 of a patient or a subject 6061 and enter a photoelectric converter 6040 having a phosphor mounted thereon. The X-rays entering the converter have information on internal portions of the body of the patient 6061. The phosphor emits light in correspondence with the X-rays incident thereon. This light is converted into electrical information by photoelectric conversion. This information is converted into a digital form and undergoes image processing performed by an image processor 6070. After the image processing, the information can be observed through a display 6080 in a control room.

Also, this information can be transmitted to a remote place by a transmission means, e.g., a telephone line 6090 to be displayed on a display screen 6081 in a doctor room or the like or stored on a storage means such as an optical disc to be used for diagnosis by a doctor in the remote place. The information can also be recorded on a film 6110 by a film processor 6100.

What is claimed is:

1. A radiographic image pickup apparatus comprising:

a substrate;

a plurality of pixels each of which is constituted by a MIS-type photoelectric conversion device and a switching device, the pixels being two-dimensionally arranged on the substrate;

a plurality of control wirings connected to control electrodes of the switching devices;

a plurality of signal wirings for reading signals from the MIS-type photoelectric conversion devices; and first bias-switching means for switching a bias for turning on the switching device to at least one of a first bias and a second bias, wherein the first bias is a bias for a refresh operation for sweeping off carriers remaining in the MIS-type photoelectric conversion device, and the second bias is a transfer bias for transferring signal charge accumulated in the MIS-type photoelectric conversion device to the corresponding one of the signal wirings.

2. A radiographic image pickup apparatus according to claim 1, wherein the switching devices connected in common to one of the control wirings are turned on by the second bias to perform a transfer operation, and the switching devices connected to the control wiring are thereafter turned on by the first bias to perform the refresh operation with respect to each line.

3. A radiographic image pickup apparatus according to claim 1, wherein an amorphous silicon semiconductor is used as a material for the MIS-type photoelectric conversion device and the switching device.

4. A radiographic image pickup apparatus according to claim 1, wherein the switching device comprises a thin-film transistor.

5. A radiographic image pickup apparatus according to claim 4, wherein: the MIS-type photoelectric conversion device is constituted by a first metallic thin film layer formed as a lower electrode, an amorphous silicon nitride insulating layer (a-SiNx), a hydrogenated amorphous silicon photoelectric conversion layer (a-Si:H), an N-type injection blocking layer for blocking injection of holes, and a second metallic thin film layer placed as an upper electrode on a portion of a transparent electroconductive layer or the injection blocking layer, which are arranged on the substrate in the stated order; the switching device is constituted by a first metallic thin film layer formed as a lower gate electrode, an amorphous silicon nitride gate insulating layer (a-SiNx), a hydrogenated amorphous silicon semiconductor layer (a-Si:H), an N-type ohmic contact layer, and a transparent elecroconductive layer or a second metallic thin film layer formed as source and drain electrodes, which are arranged on the substrate in the stated order; in a refresh mode, an electric field is applied to the MIS-type photoelectric conversion device in such a direction as to cause holes to move from the photoelectric conversion layer toward the second metallic thin film layer; in a photoelectric conversion mode, an electric field is applied to the MIS-type photoelectric conversion device in such a direction as to make carriers generated by light entering the photoelectric conversion layer remain in the photoelectric conversion layer, and to cause electron carriers also generated by the light to move toward the second metallic thin film layer; and hole carriers accumulated in the photoelectric conversion layer or the electron carriers caused to move toward the second metallic thin film layer in the photoelectric conversion mode are detected as an optical signal.

6. A radiographic image pickup apparatus according to claim 1, further comprising a wavelength conversion member for performing wavelength conversion of radiation.

7. A radiographic image pickup apparatus according to claim 1, wherein the first bias is higher than the second bias.

8. A radiographic image pickup apparatus according to claim 1, further comprising a bias wiring for applying the bias to the photoelectric conversion device.

9. A radiographic image pickup apparatus according to claim 8, further comprising a second bias-switching means for changing the bias applied to the bias line, wherein a third bias constituting at least one bias switched by the second bias-switching means is a bias for a second refresh operation.

10. A radiographic image pickup apparatus according to claim 9, wherein the second refresh operation is for a still image.

11. A radiographic image pickup apparatus according to claim 9, wherein the refresh operation is performed with respect to each of sensor rows to obtain moving images in such a manner that, after the signal transfer operation has been performed with respect to an nth sensor row, the refresh operation of the nth sensor row is performed.

12. A method of driving a radiographic image pickup apparatus according to claim 9, comprising:

a seethrough mode in which the first bias is applied to the photoelectric conversion device to refresh the same; and a photographing mode in which the third bias is applied to the photoelectric conversion device to refresh the same.

13. A method of driving a radiographic image pickup apparatus according to claim 1, comprising:

performing the refresh operation for sweeping off carriers remaining in the MIS-type photoelectric conversion device by the first bias; and transferring the signal charges accumulated in the MIS-type photoelectric conversion device to the signal wiring by the second bias.

14. A radiographic image pickup system comprising:

a radiographic image pickup apparatus according to claim 1;

irradiation means for irradiating the radiographic image pickup apparatus with radiation;

a signal processing circuit for processing a signal from the radiographic image pickup apparatus;

recording means for recording a signal from the signal processing circuit;

a display means for displaying a signal from the signal processing circuit; and transmission processing means for transmitting a signal from the signal processing circuit.

* * * * *